United States Patent
Koizumi

(10) Patent No.: US 7,081,607 B1
(45) Date of Patent: Jul. 25, 2006

(54) SOLID STATE IMAGE PICKUP DEVICE AND IMAGE PICKUP SYSTEM

(75) Inventor: Toru Koizumi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/678,025

(22) Filed: Oct. 4, 2000

(30) Foreign Application Priority Data

Oct. 5, 1999 (JP) .................................. 11-284463

(51) Int. Cl.
*H01L 27/00* (2006.01)

(52) U.S. Cl. ..................................... 250/208.1; 348/302

(58) Field of Classification Search ............. 250/208.1; 348/300, 301, 302, 308
See application file for complete search history.

(56) References Cited

U.S. PATENT DOCUMENTS

| | | | |
|---|---|---|---|
| 4,349,743 A * | 9/1982 | Ohba et al. ................. 348/303 |
| 4,959,723 A | 9/1990 | Hashimoto ............. 358/213.11 |
| 4,962,412 A | 10/1990 | Shinohara et al. ............ 357/30 |
| 5,237,423 A * | 8/1993 | Goto et al. .................. 348/262 |
| 5,386,108 A | 1/1995 | Arikawa et al. ......... 250/208.1 |
| 5,406,332 A | 4/1995 | Shinohara et al. .......... 348/308 |
| 5,698,844 A | 12/1997 | Shinohara et al. ...... 250/214 R |
| 5,831,258 A * | 11/1998 | Street ...................... 250/208.1 |
| 5,894,325 A * | 4/1999 | Yonemoto .................. 348/302 |
| 5,898,168 A * | 4/1999 | Gowda et al. ........... 250/208.1 |
| 5,955,753 A * | 9/1999 | Takahashi ................... 257/292 |
| 6,002,287 A | 12/1999 | Ueno et al. ................. 327/307 |
| 6,054,704 A * | 4/2000 | Pritchard et al. ........ 250/208.1 |
| 6,091,449 A * | 7/2000 | Matsunaga et al. ......... 348/308 |
| 6,188,094 B1 * | 2/2001 | Kochi et al. ................ 257/232 |

FOREIGN PATENT DOCUMENTS

| | | |
|---|---|---|
| JP | 7-30084 | 1/1995 |
| JP | 11-121731 | 4/1999 |
| JP | 2000-152086 | 5/2000 |

* cited by examiner

*Primary Examiner*—Edward J. Glick
*Assistant Examiner*—Chih-Cheng Glen Kao
(74) *Attorney, Agent, or Firm*—Fitzpatrick, Cella, Harper & Scinto

(57) ABSTRACT

A solid image pickup device is disclosed which comprises at least one unit cell having a photoelectric conversion portion, an amplifying means for amplifying a signal generated in the photoelectric conversion portion, a transfer means for transferring the signal to the amplifying means, a reset means for resetting an input terminal of the amplifying means, and a selecting means for selecting the amplifying means and outputting a signal to a signal output line, wherein at least two of a selection control line for controlling the selecting means, a transfer control line for controlling the transfer means, a reset control line for controlling the reset means, and the signal output line in a unit cell, or between two unit cells operating in time series fashion, or between two adjoining unit cells are one common line.

13 Claims, 30 Drawing Sheets

FIG. 32

| | PERIOD A | PERIOD B | PERIOD C | PERIOD D |
|---|---|---|---|---|
| nTH ROW SELECTING SWITCH LINE | — | ON | — | ON |
| nTH ROW RESET SWITCH LINE | ON | OFF* | OFF* | OFF* |
| nTH ROW TRANSFER SWITCH LINE | OFF | OFF | ON | OFF |
| OUTPUT LINE | — | float | — | float |
| n-1 TH ROW SELECTING SWITCH LINE | — | OFF | — | OFF |
| n-1 TH ROW RESET SWITCH LINE | — | — | — | — |
| n-1 TH ROW TRANSFER SWITCH LINE | — | — | — | — |
| n+1 TH ROW SELECTING SWITCH LINE | — | OFF | — | OFF |
| n+1 TH ROW RESET SWITCH LINE | — | — | — | — |
| n+1 TH ROW TRANSFER SWITCH LINE | OFF | OFF | OFF | OFF |

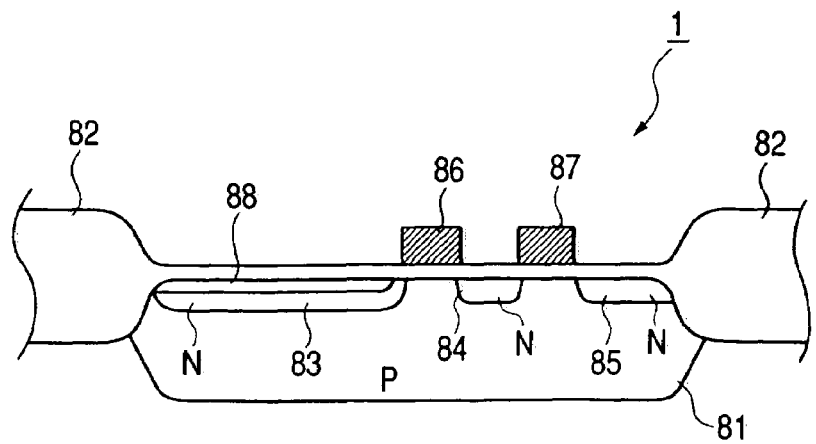

FIG. 33

SOLID STATE IMAGE PICKUP DEVICE AND IMAGE PICKUP SYSTEM

BACKGROUND OF THE INVENTION

1. Field of the Invention

The present invention relates to a solid image pickup device as well as an image pickup system, and in particular relates to a solid image pickup device as well as an image pickup system having signal amplification means per pixel.

2. Related Background Art

As representatives of solid image pickup devices, there is a CCD image sensor comprising photodiodes and CCD shift-registers and an APS (Active Pixel Sensor) comprising photodiodes and MOS transistors.

The APS comprises per pixel a photodiode, a MOS switch, and an amplifying circuit to amplify a signal from the photodiode and has a lot of advantages such that "XY addressing" and "integration of a sensor and a signal processing circuit into one chip" are possible.

Moreover, in recent years, the APS is attracting attention due to improvement in microfabrication technology for MOS transistors and increased requirement for "integration of a sensor and a signal processing circuit into one chip" and "reduction in power consumption," etc.

FIG. 28 is a circuit diagram of a solid image pickup device constituting an area image sensor of the prior art. A unit cell 1 corresponding to one pixel has a photodiode 3, a transfer switch Q1, a reset switch Q2, amplifying means Q3, and a selecting switch Q4.

As for electrodes as well as wirings for outputting optical signal, there are:

electrodes 17 as well as selection control lines (selecting switch lines) 7 for selecting unit cells;

electrodes 16 as well as transfer control lines (transfer switch lines) 6 for transferring an electric charge from photodiodes 3 as the photoelectric conversion portions into input terminals of amplifying means;

electrodes 15 as well as reset control lines (reset switch lines) 5 for resetting the input terminals of the amplifying means; and electrodes 18 as well as signal output lines 8 for outputting signal.

Reference numeral 4 denotes a power line for providing a reference voltage to the amplifying means and the reset switch.

Among these components, except the power lines 4, the three kinds of lines 5, 6, and 7 are disposed in the direction of rows, and the signal output lines 8 are disposed in the direction of columns. In general, these wirings are disposed at the shortest wiring distance as well as at the narrowest line width that can be attained in the manufacturing process so as not to reduce the numerical aperture.

For example, as for the length of those wirings, the length of a wiring per row could reach 10 mm in a sensor with a diagonal distance of 16.93 mm (⅔ inch) and about two million pixels. Further, since the number of rows are approximately 1000, the total length of the control lines will reach 10 m.

However, since the APS has a larger number of elements within one pixel (within one unit cell) as compared with the CCD image sensor, and since the size of a chip has been increased with the tendency of enlargement of the sensor area in recent years, a lowering in the manufacturing yield related to wiring is liable to arise.

SUMMARY OF THE INVENTION

An object of the present invention is to provide with a solid image pickup device and a solid image pickup system that can reduce wiring counts than in a conventional solid image pickup device.

According to the present invention, there is provided a solid image pickup device comprising at least one unit cell having a photoelectric conversion portion, an amplifying means for amplifying a signal generated in the photoelectric conversion portion, a transfer means for transferring the signal to the amplifying means, a reset means for resetting an input terminal of the amplifying means, and a selecting means for selecting the amplifying means and outputting a signal to a signal output line, wherein at least two of a selection control line for controlling the selecting means, a transfer control line for controlling the transfer means, a reset control line for controlling the reset means, and the signal output line in a unit cell, or between two unit cells operating in time series fashion, or between two adjoining unit cells are comprised of one common line.

The operation of a solid image pickup device will be described in detail with reference to FIGS. 29 to 32.

FIG. 29 is a circuit diagram of a readout circuit of a solid image pickup device in which unit cells are arranged in a two-dimensional matrix pattern, and FIG. 30 is a drive timing chart of driving pulses used in this solid image pickup device.

In FIG. 29, a signal output line 8 is provided with a signal holding means having a holding capacity 23 that can hold a noise signal with a switch 22, and a holding capacity 25 that can hold a signal which contains an optical signal (which contains a noise signal in addition to a pure optical signal and is hereinafter referred to as "an optical signal containing a noise signal") with a switch 24. These two kinds of signals are separately read out by a horizontal scanning circuit 26 into horizontal common output lines 27 and 28. And, with a differential amplifier 29, the noise signal is subtracted from the optical signal to provide an optical signal from which a noise component has been removed.

With reference to FIG. 30, the operation (read-out system) of a solid image pickup device will be described in detail. In the following, the case will be described wherein an OFFSET noise in a signal amplifying portion as the largest noise generated in a unit cell and a heat noise generated at the time of resetting are removed.

In general, the OFFSET noise resulting from the dispersion of threshold values of amplifying transistors Q3 is from several tens to several hundreds mV and the heat noise ($\sqrt{kTC}$ noise) is about 1 mV.

In order to read out signals, at least operations to be implemented during periods A2 to D2 are implemented as shown in FIG. 30. Reference character φ15 denotes a controlling pulse applied via a reset switch line 5 to an electrode 15 connected thereto while reference character φ17 denotes a controlling pulse applied via a selecting switch line 7 to an electrode 17 connected thereto, reference character φ16 denotes a controlling pulse via a transfer switch line 6 to an electrode 16 connected thereto, reference character φ22 denotes a controlling pulse of a switch 22, and reference character φ24 denotes a controlling pulse of a switch 24, respectively.

During the period A2 in the figure, the reset switch Q2 is turned on with the reset switch line 5 being set at a high level so that the input terminal of the amplifying transistor Q3 as an amplifying means constituting a source follower is reset.

Next, during the period B2, the switch 22 is turned on and then turned off so that the noise signal of resetting are held in the holding capacity 23 for the noise signal. When a source follower is used as an output portion of a unit cell as shown in FIG. 28, an OFFSET noise resulting from dispersion of threshold values of transistors Q3 and a heat noise generated when resetting an input portion of the transistor Q3 with a reset switch Q2 are held in the holding capacity 23.

During the period C2, the electric charge transfer switch Q1 is turned on and then turned off so that an electric charge generated by light in a photodiode 3 is transferred to the input portion of the amplifying transistor Q3, whereby the electric charge generated in the photodiode by light is added to the noise signal.

During the period D2, the switch 24 is turned on and then off so that the output of the optical signal containing the noise signal generated during the period C2 are held in the holding capacity 25 for optical signals.

After the operation is over, the noise signal as well as the optical signal containing the noise signal are read out into horizontal common output lines 27 and 28 by the horizontal scanning circuit 26 and the noise signal component is removed with the differential amplifier 29. Thus, the optical signal from which the noise signal component has been removed can be taken out from an output terminal 30.

FIG. 31 is another drive timing chart used in the solid image pickup device. In this operation (read-out system), after resetting (period A3), transfer operation (period C3) is implemented, and after an optical signal containing a noise signal is held (period B3) in the holding capacity 25, the input terminal of the source follower is reset (period A3), and the noise signal is held (period D3) in the holding capacity 23 so that the difference between the both is taken.

In this case, although the heat noise generated when resetting the amplifying MOS transistor Q3 cannot be removed, the OFFSET noise as large as several tens to several hundreds mV resulting from the dispersion in threshold values of the amplifying transistors Q3 can be removed.

Incidentally, the present invention will not be limited to the read-out system described above.

Then, the present inventor has analyzed in what state each control line should be in each period. The results thereof are shown in FIG. 32.

In FIG. 32, the symbol "-" shows that the line in question may be in any state. In addition, the symbol "OFF*" means that it does not need to be 0 volt since the voltage of the input terminal of the source follower is comparatively high.

The present inventor has obtained important knowledge from the results, which will be described with reference to examples. The by one-row preceding pixels already read out are in a storage period. Accordingly, the transfer switch line should be in off-state. However, the solid image pickup system has been diversified, and the system is being designed so as to match with a variety of driving methods such as the rolling shutter system and the progressive scan system, etc. Moreover, even a general-purpose image sensor of 330-thousand pixel class has 500 rows, and the tendency for the number of pixels to increase results in increase of the number of rows thereof.

From the viewpoint described above, even if the transfer switch of the by one-row preceding row is turned on, although the storage time is shortened by a time period of one row, the time period corresponds to 1/500 of the whole and therefore merely reduces the sensibility down to 99.8%. That is, the transfer switch of a unit cell for the n-1 th row can be held in common with a control line other than the transfer switch line of the unit cell for the en th row.

As a result of analyzing FIG. 32 from such a point of view, the control lines that are compatible in terms of the state of each control line during each period have become clear. That is, as for the following lines, a wiring can be held in common with each other, in a unit cell, or between two unit cells operating in time series fashion, or between two adjoining unit cells.

(1) common use of one line for the reset switch line being connected with a gate of the reset switch and the signal output line;

(2) common use of one line for the n th row selecting switch line being connected with a gate of the selecting switch and the n–1 th row reset switch line;

(3) common use of one line for the n th row selecting switch line and the n–1 th row transfer switch line being connected with a gate of the transfer switch; and (4) common use of one line for the n th row reset switch line and the n–1 th row transfer switch line.

In addition, in a digital camera, since a mechanical shutter or the like is utilized, the storage time is not determined by the opening/closure of a transfer switch but is determined by the opening/closure of a mechanical shutter.

In such a case, when used in combination with the read-out method shown in FIG. 31, (3') common use of one line for the n th row selecting switch line and the n+1 th row transfer switch line; and (4') common use of one line for the n th row reset switch line and the n+1 th row transfer switch line are also made possible.

Moreover, (5) common use of one line for the signal output line and the transfer switch line will become feasible.

Thus, if the common usage of one line is effected, since a single common line will have the functions of a plurality of control lines, it is possible to reduce the number of lines in a solid image pickup device, thus widening the margin in design and remarkably improving manufacturing yield related to wiring.

BRIEF DESCRIPTION OF THE DRAWINGS

FIG. 32 is a view showing a state required for each control line; and

FIG. 33 is a schematic sectional view of a unit cell.

DETAILED DESCRIPTION OF THE PREFERRED EMBODIMENTS

The preferred embodiments of the present invention will be described below.

Embodiment 1

Figure 1:
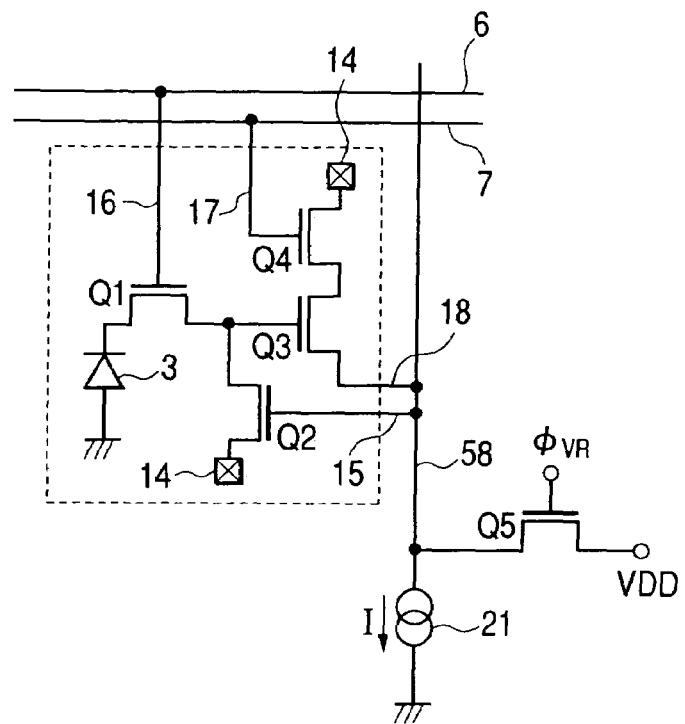
FIG. 1 is a circuit diagram showing a basic configuration of a solid image pickup device according to an embodiment of the present invention.
Figure 2:
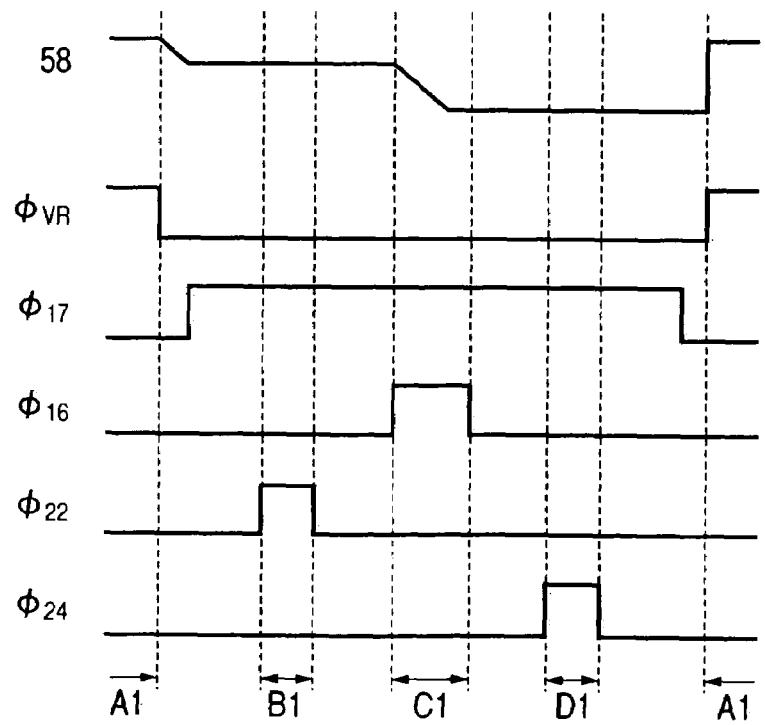
FIG. 2 is a drive timing chart illustrating a basic operation of the solid image pickup device of FIG. 1.

FIG. 1 is a basic circuit diagram of a unit cell of a solid image pickup device according to this embodiment, and FIG. 2 is a drive timing chart for illustrating a basic operation of the device.

This embodiment has a signal output line and a reset switch line comprised of (or configured by) one common line as shown by the reference numeral 58.

A unit cell 1 corresponding to one pixel has at least a photodiode 3 as a photoelectric conversion portion, a transfer switch Q1 as a transfer means, a reset switch Q2 as a reset means, an amplifying means Q3, and a switch Q4 as a selecting means.

As electrodes and wirings to output optical signals, it has:

an electrode 17 as well as a selection control line (selecting switch line) 7 to select a unit cell, and an electrode 16 as well as transfer control line (transfer switch line) 6 to transfer an electric charge from the photodiode 3 to become a photoelectric conversion portion to an input terminal of an amplifying means.

Moreover, the electrode 15 to reset the input terminal of the amplifying means and the electrode 18 to output a signal are both connected to a common line 58 so that this common line 58 serves as a reset control line (reset switch line) and a signal output line.

Reference numeral 14 denotes an electrode for providing a reference voltage, which is connected to a power source line (not shown) and receives a reference voltage supply. A reference voltage for resetting supplied to the reset switch Q2 and a reference voltage for amplification supplied to the amplifying means Q3 may be equal to or different from each other.

The switch Q5 is a switch for giving a control pulse to turn on the reset switch Q2 and gives to the gate of the reset switch from a reference voltage source VDD, a voltage (ON-state voltage) not less than the threshold value sufficient to turn it on. Reference numeral 21 denotes a constant-current source as a load and comprises a mirror circuit, etc., but may be a load comprising a resistance, a transistor, etc.

An outline of the operation of this solid image pickup device is as follows.

During a period A1 shown in FIG. 2, in order to reset an input terminal of the amplifying transistor Q3 constituting the source follower, the switch Q5 is turned on with the control pulse φVR, and a high level voltage is applied to the signal output line 58. At this time, since a gate electrode 15 of the reset switch Q2 is connected to the signal output line 58, the input terminal of the source follower is reset to a reset voltage via the reset switch Q2 as turned into on-state. Although all the pixels connected to the signal output line 58 are reset at a time, the transfer switch Q1 remains in off-state, so that there is no obstacle.

Figure 29:
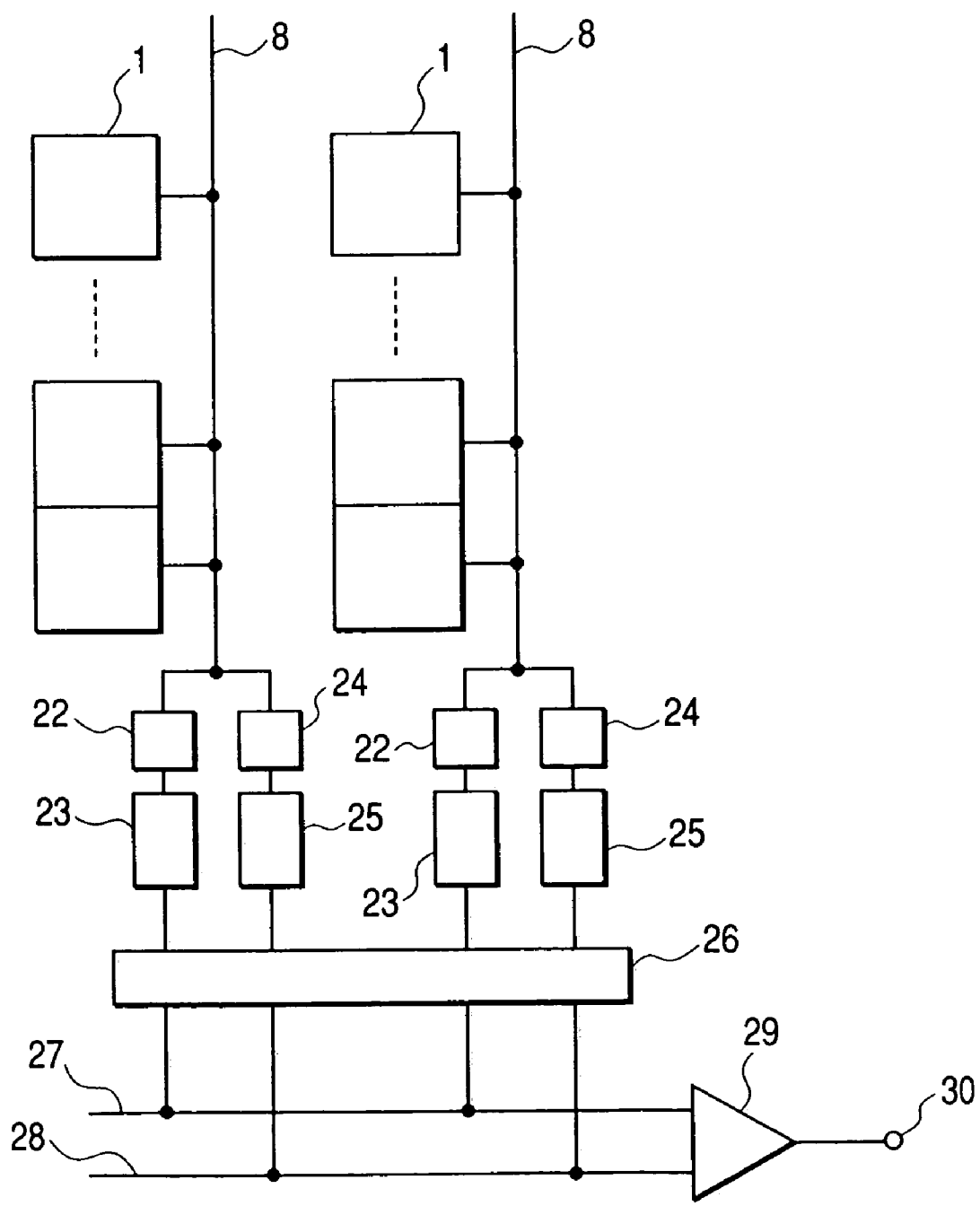
FIG. 29 is a circuit diagram showing a configuration of a peripheral circuit of a solid image pickup device.
Figure 30:
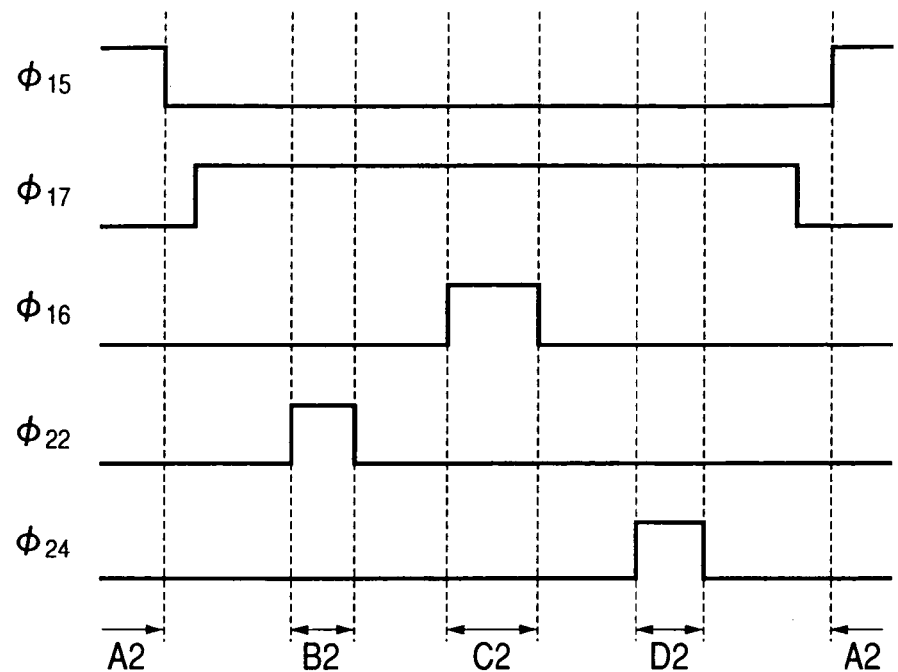
FIG. 30 is a view showing an example of drive timing of a solid image pickup device.

Next, in order to read out a noise signal such as a reset noise, the switch Q5 is turned off with a control pulse φVR. Moreover, with a control pulse φ17, a high level voltage is applied to selecting switch line 7 to turn on the selecting switch Q4. As a consequence hereof, the signal output line 58 is lowered to a low voltage by the constant-current load 21 of the source follower. At this time, the source follower operates and a voltage appearing in the signal output line 58 will become a voltage that has dropped from the reset voltage by a voltage similar to the threshold value voltage. The switch 22 is turned on and then turned off with the control pulse φ22, and the output voltage is written in the holding capacity for noise signals such as shown in FIG. 29 (period B1). At this time, the gate voltage of the reset switch Q2 will become lower by a voltage corresponding to the threshold value voltage than the source voltage of the reset switch Q2, so that the reset switch Q2 will be turned off.

During the period C1, the transfer switch Q1 is turned on and then off with the control pulse φ16, and an electric charge inside the photodiode 3 is transferred to the input terminal of the source follower. At this time, the voltage of the signal output line 58 drops depending on the quantity of the electric charge. At this time point, the reset switch Q2 remains in off-state.

During the period D1, the switch 24 is turned on and then turned off with the control pulse φ24, and an output containing an optical signal is written in the holding capacity for optical signals.

Again, in order to reset the input terminal of the source follower, the switch Q5 is turned on with the control pulse φVR, and the voltage of the output signal line 58 is increased to a voltage at which the reset switch Q2 is turned on.

Thereafter, signals written into the respective holding capacities are read out with the horizontal scanning circuit into the horizontal output lines, and the differential amplifier is used to take the difference between the both. Hereby, a signal with a low noise equal to conventionally obtained one can be obtained.

Figure 3:
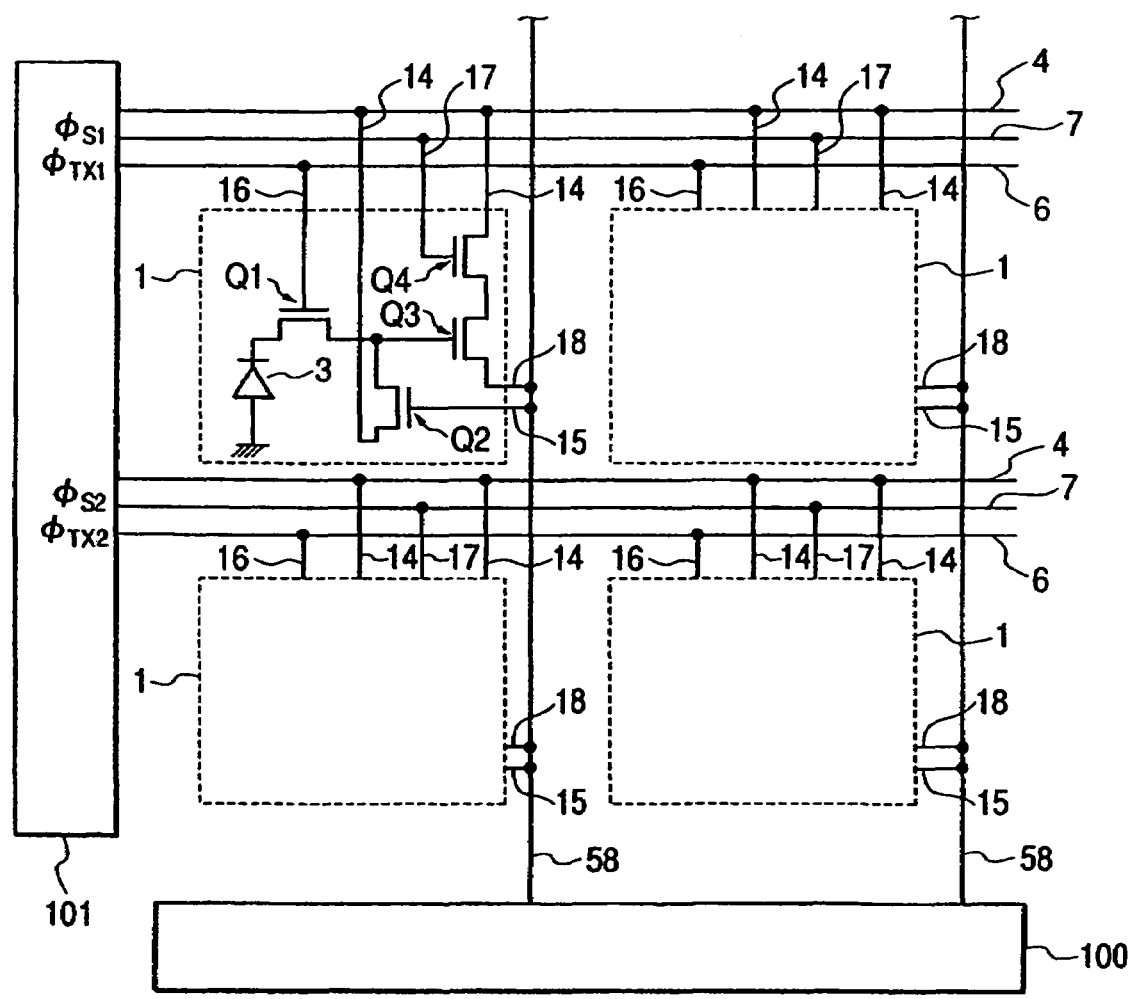
FIG. 3 is a circuit diagram of a solid image pickup device according to an embodiment of the present invention.
Figure 4:
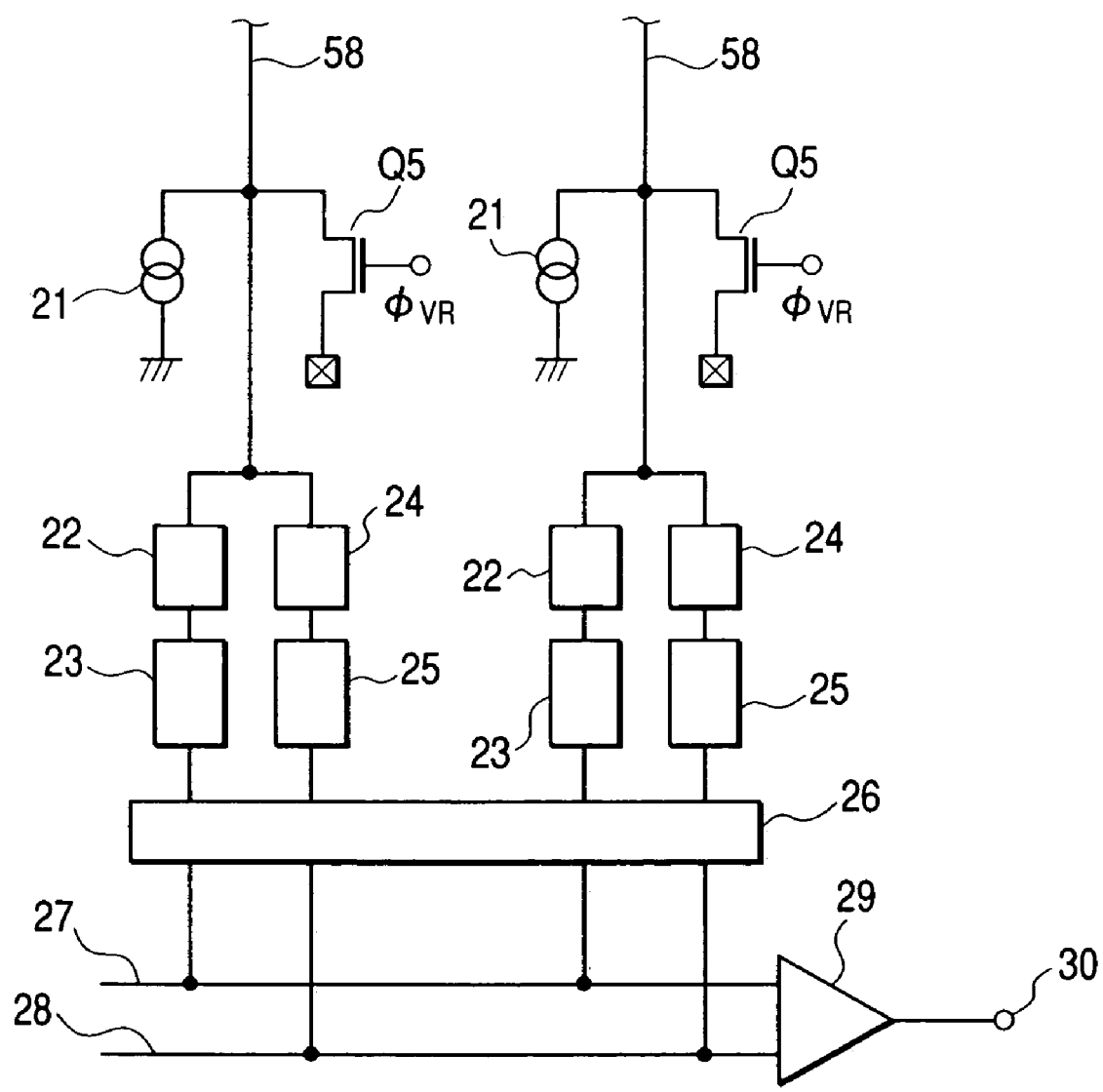
FIG. 4 is a circuit diagram of a peripheral circuit used in the present invention.
Figure 5:
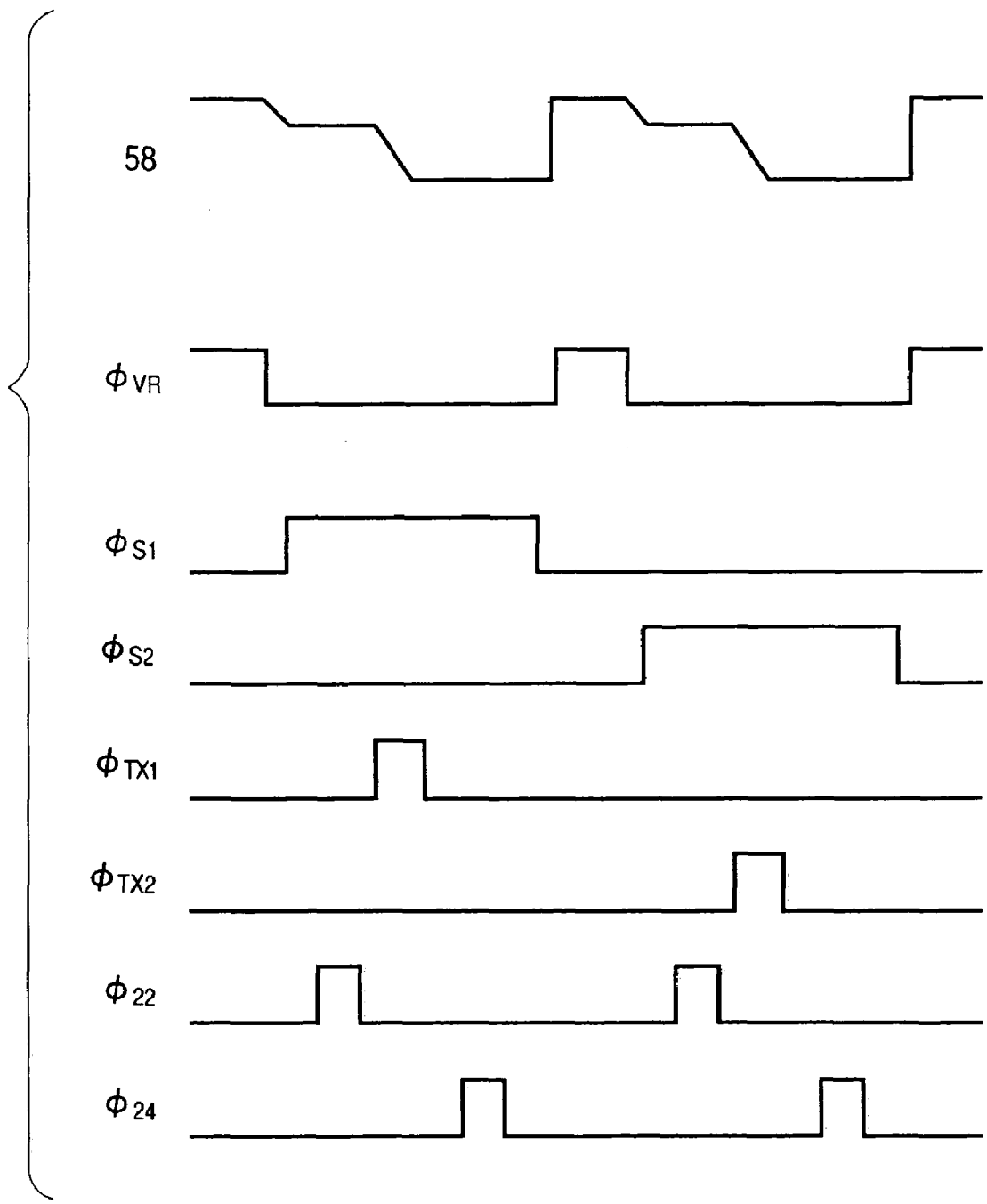
FIG. 5 is a drive timing chart illustrating an operation of the solid image pickup device of FIG. 3.

FIG. 3 is a circuit diagram of a solid image pickup device in which the unit cells configured as described above are arranged in 2 rows by 2 columns. Here, reference numeral 100 denotes a peripheral circuit including a horizontal scanning circuit, etc., and reference numeral 101 denotes a peripheral circuit including a vertical scanning circuit, etc. FIG. 4 is a circuit diagram of the peripheral circuit denoted by reference numeral 100 in FIG. 3. FIG. 5 is a drive timing chart of unit cells for two rows.

During the period A1 shown in FIG. 5, the switch Q5 is turned on with the control pulse VR and a voltage of a high level is applied to the signal output line 58. Thus, the input terminals of the source followers of all the unit cells are reset to the reset voltage via the reset switch Q2.

Next, the switch Q5 is turned off with the control pulse VR. Moreover, a high level voltage is applied to a selecting switch line 7 of the preceding row with a control pulse S1 so that the selecting switch Q4 of the preceding row is turned on. Switches 22 of all the columns are turned on and then off with the control pulse 22 and the output voltages thereof are written into the holding capacities 23 for noise signals (period B1). At this time, the gate voltage of the reset switch Q2 will be lowered by a voltage corresponding to the threshold value voltage than the source voltage of the reset switch Q2 so that the reset switch Q2 will be turned off.

During the period C1, the control pulse φTX1 supplied to the transfer switch line 6 of the preceding row turns on and then off the transfer switch Q1 of the preceding row so that the electric charge inside the photodiode 3 is transferred to the input terminal of the source follower. At this time, the voltage of the signal output line 58 drops depending on the quantity of the electric charge, but the reset switch Q2 remains in off-state.

During the period D1, the switch 24 is turned on and then off with the control pulse φ24 so that the optical signal output containing the noise signal component is written in the holding capacity 25 for optical signals.

For selecting the succeeding row, the switch Q5 is again turned on with the control pulse φVR to turn on the reset switch Q2.

Thereafter, with the operation similar to that described above, the operation to read out two kinds of signals from each unit cell of the succeeding row is implemented.

During the period of operation of selecting the succeeding row, or between the period of selecting the preceding row and the period of selecting the succeeding row, the signals from each unit cell of the preceding row written in the holding capacities 23 and 25 are read out into the horizontal output lines 27 and 28 with the horizontal scanning circuit 26, and the difference between the both signals is taken out with the differential amplifier 29 to be output. By this procedure, a signal with a low noise equal to conventional one can be obtained.

Adopting the circuit configuration of this embodiment, the yield regarding wiring, which was hitherto about 50%, is estimated to be increased to about 70%.

Embodiment 2

Figure 6:
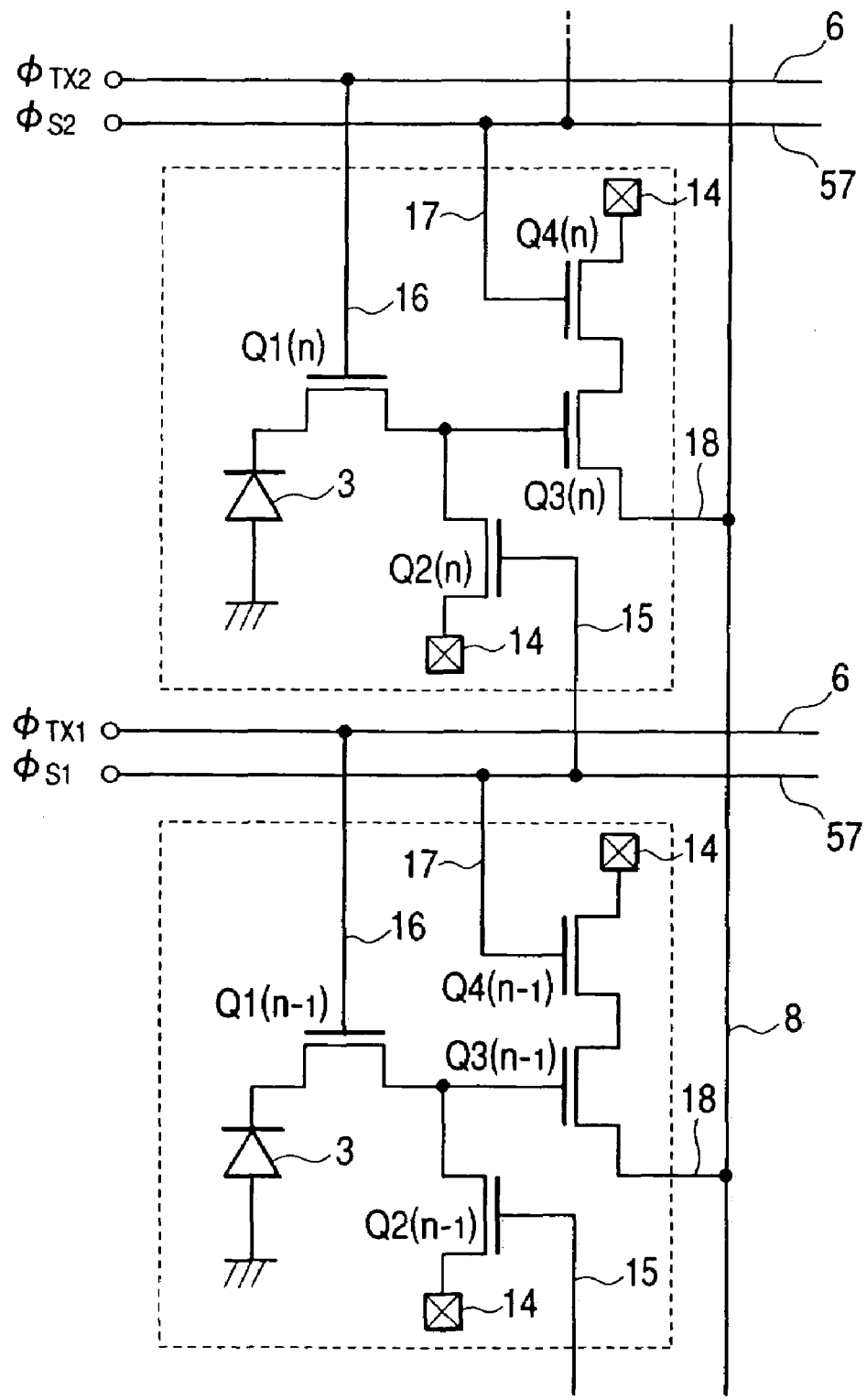
FIG. 6 is a circuit diagram showing a basic configuration of a solid image pickup device according to another embodiment of the present invention.
Figure 7:
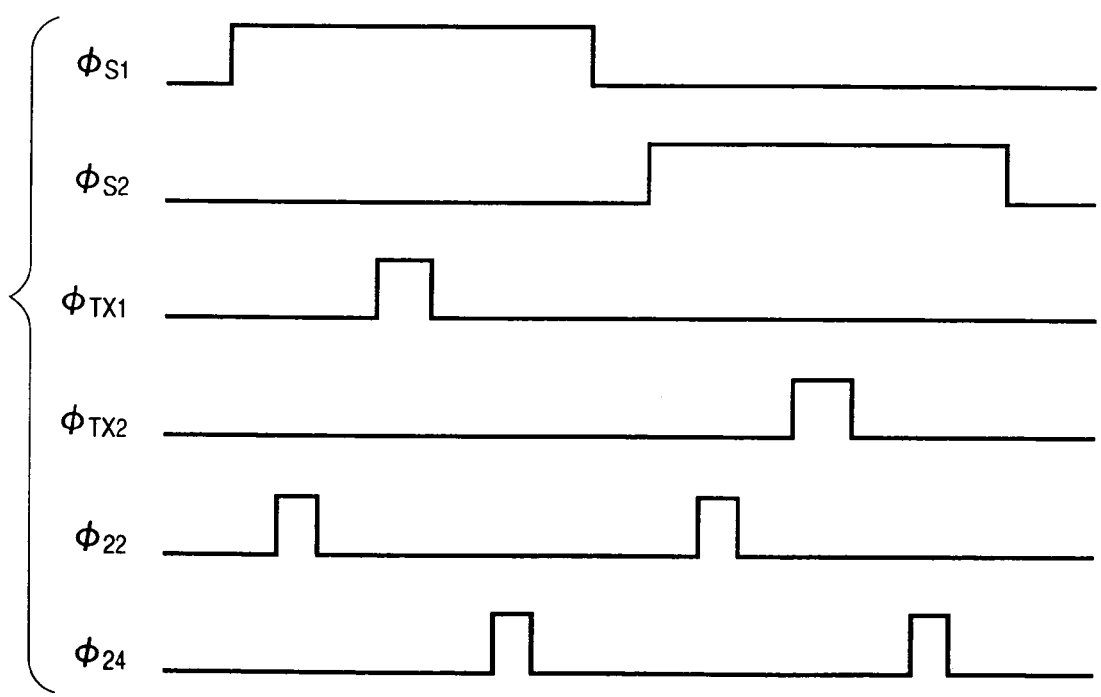
FIG. 7 is a drive timing chart illustrating a basic operation of the solid image pickup device of FIG. 6.
Figure 8:
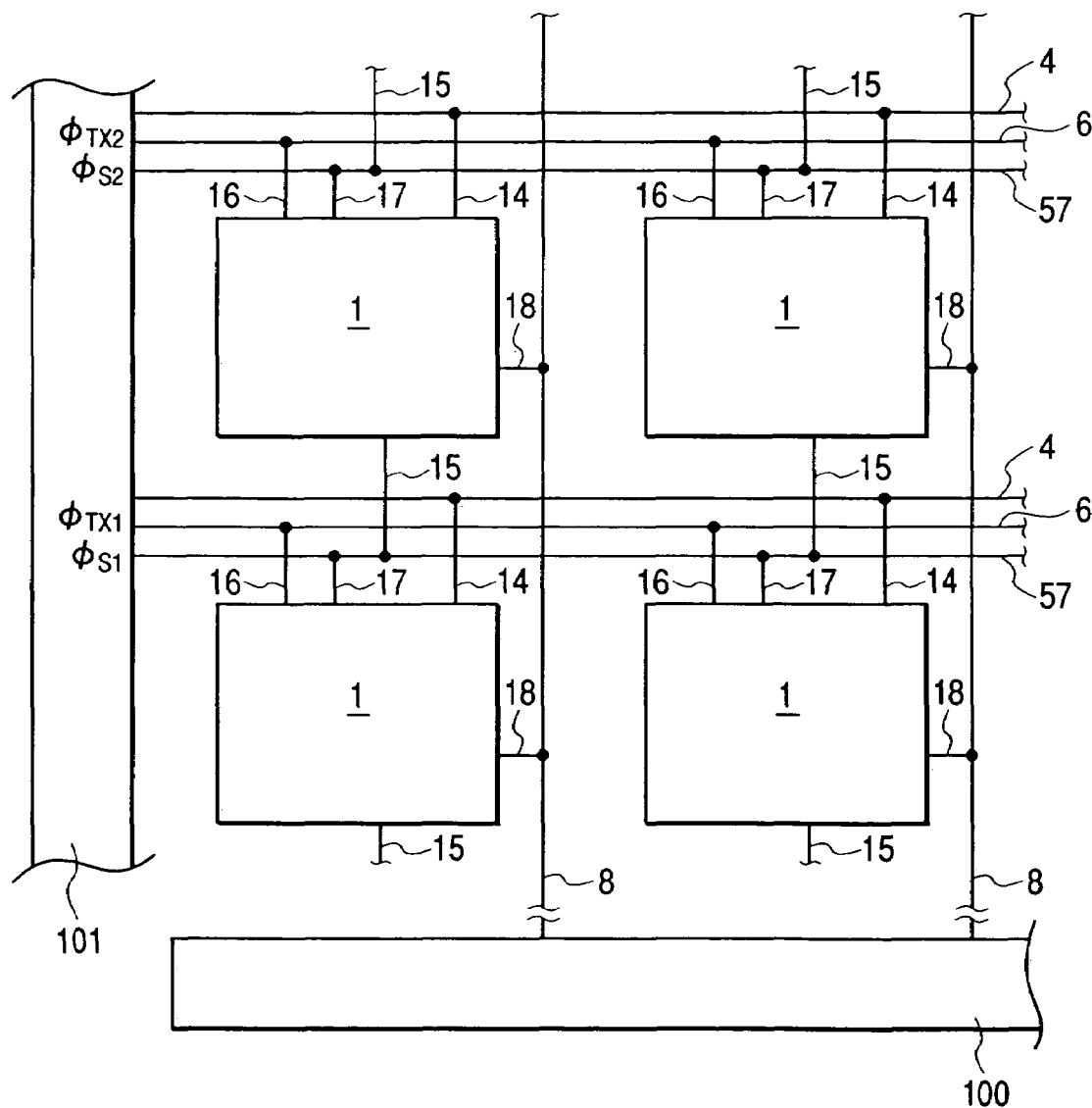
FIG. 8 is a circuit diagram of a solid image pickup device according to another embodiment of the present invention.

FIG. 6 is a circuit diagram of two unit cells of the solid image pickup device of this embodiment, FIG. 7 is a drive timing chart thereof, and FIG. 8 is a circuit diagram for 2 rows by 2 columns of a solid image pickup device in which unit cells are arranged in a matrix pattern.

In this embodiment, one line is multi-used both as a reset switch line for an n-th row and as a selecting switch line for an (n−1)-th row. In FIG. 6, reference numeral 57 denotes a wiring (common line) that are held and used in common between unit cells of two adjoining rows. Reference characters $Q1(n)$, $Q2(n)$, $Q3(n)$, and $Q4(n)$ respectively denote a transfer switch, a reset switch, an amplifying transistor, and a selecting switch of a unit cell of an n-th row while $Q1(n-1)$, $Q2(n-1)$, $Q3(n-1)$, and $Q4(n-1)$ respectively denote a transfer switch, a reset switch, an amplifying transistor, and a selecting switch of a unit cell of (n−1)th row.

The operation is as follows.

After the unit cells of an (n−1)-th row have been reset, a control pulse φS1 is supplied to the selecting switch line 57 of the (n−1)-th row to turn on the selecting switch $Q4(n-1)$. The control pulse φ22 is supplied to the switch 22 of the signal output line to store a noise signal in the capacity 23. The control pulse φTX1 is input into the transfer switch line 6 of the (n−1)-th row to turn on the transfer switch $Q1(n-1)$, thus transferring the optical signal. The control pulse φ24 is supplied to the switch 24 so that an optical signal containing a noise signal is read out to the capacity 25. Thus, readout of the unit cell of the (n−1)-th row is effected.

When the (n−1)-th row is selected, the control pulse φS1 for resetting the input terminal of the source follower of the unit cell of the n-th row is supplied, which turns on the switch $Q2(n)$ so that the input terminal of the source follower is reset at a reset voltage via the reset switch $Q2(n)$.

In addition, since the reset switch is turned on during the period of selecting the preceding row, in the case where the reset switch is kept in on-state throughout the storage period, the current source of the source follower will become active. In the case where the number of pixels are large, a current of (constant-current value)×(number of columns) will always flow, it is preferable that a switch (not shown) is disposed between the current source and the signal output line 8.

In order to read out the noise signal of a unit cell of the n-th row, the reset switch $Q2(n)$ of the pixel of the n-th row is turned off.

Next, the selecting switch line 57 of the n-th row is shifted to a high level with the control pulse φS2 to open the selecting switch $Q4(n)$. This allows the source follower to operate so that the signal output line 8 will be provided with a voltage lower than the reset voltage by a voltage approximately equivalent to the threshold value voltage. The switch 22 is turned on and then off so that the output voltage is written into the holding capacity 23 for noises. At this time, the reset switch Q2(n+1) of the (n+1)-th row is turned on, but if the selecting switch Q4(n+1) of the (n+1)-th row is in off-state, the output value will not be affected in any way.

In addition, the transfer switch Q1(n) of the unit cell of the n-th row is turned on and then off with the control pulse φTX2 so that the electric charge inside the photodiode is transferred to the input terminal of the source follower.

The switch 24 is turned on so that an optical signal containing a noise signal is written into the holding capacity 25 for optical signals.

The configuration of the peripheral circuit 100 and operation therein are the same as in FIGS. 4 and 29, and therefore description thereof will be omitted.

The yield regarding the conventional wiring was approximately 50%, but according to this embodiment it is estimated to rise approximately to 72%.

Embodiment 3

Figure 9:
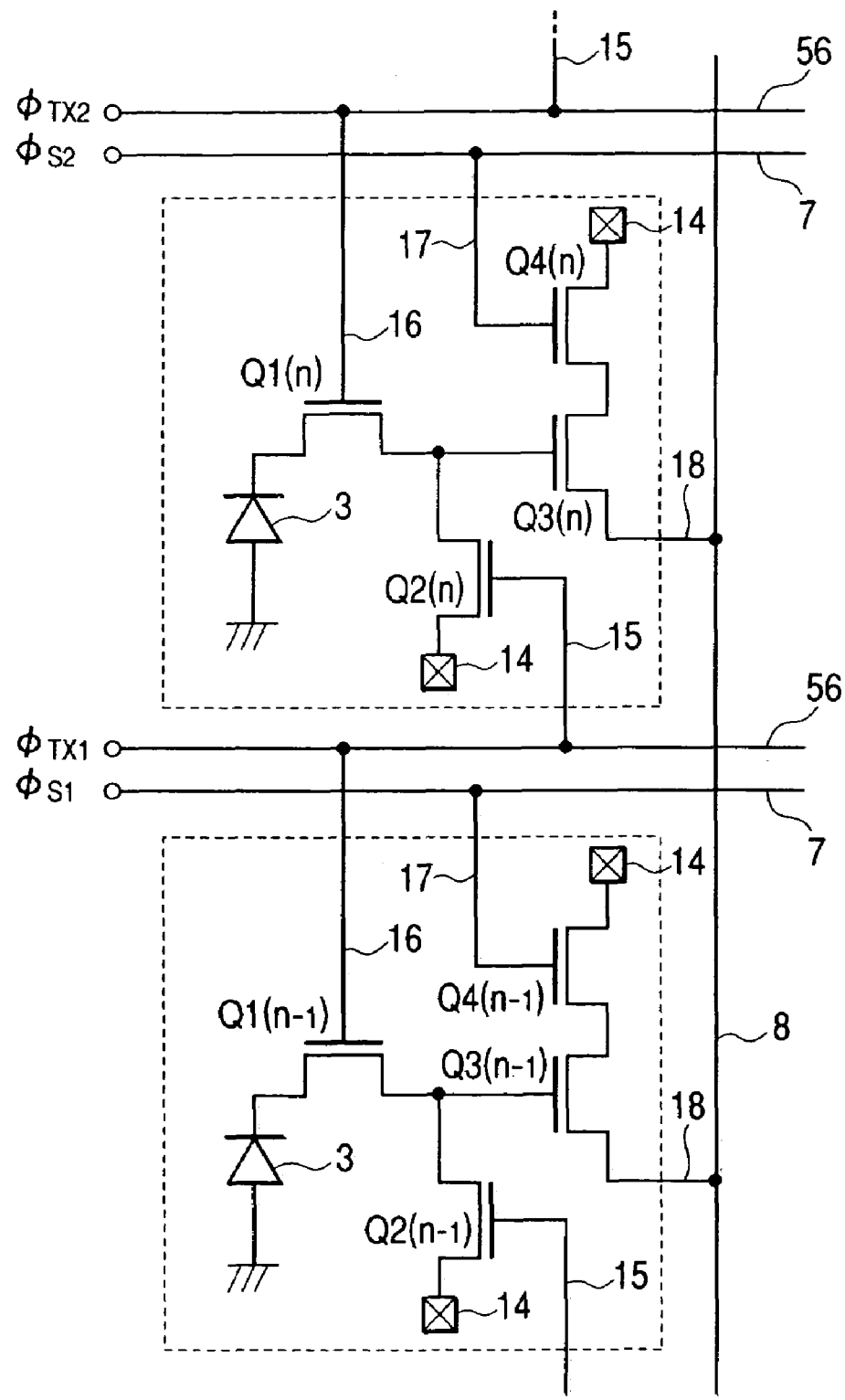
FIG. 9 is a circuit diagram showing a basic configuration of a solid image pickup device according to still another embodiment of the present invention.
Figure 10:
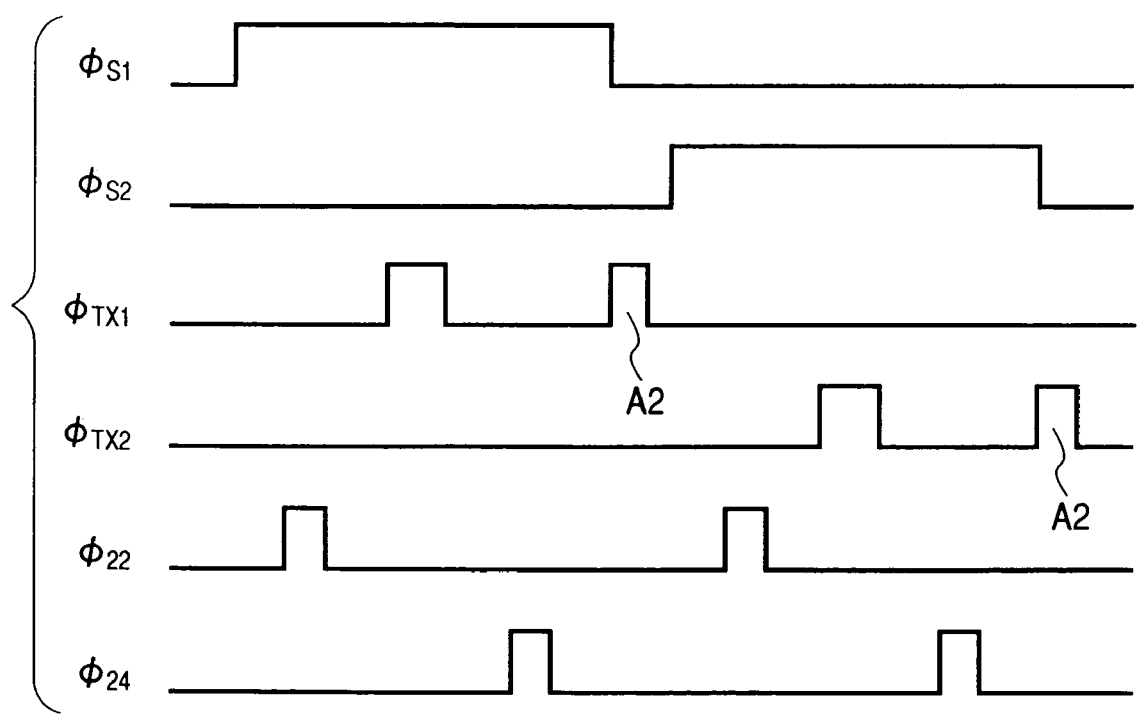
FIG. 10 is a drive timing chart showing a basic operation of the solid image pickup device of FIG. 9.
Figure 11:
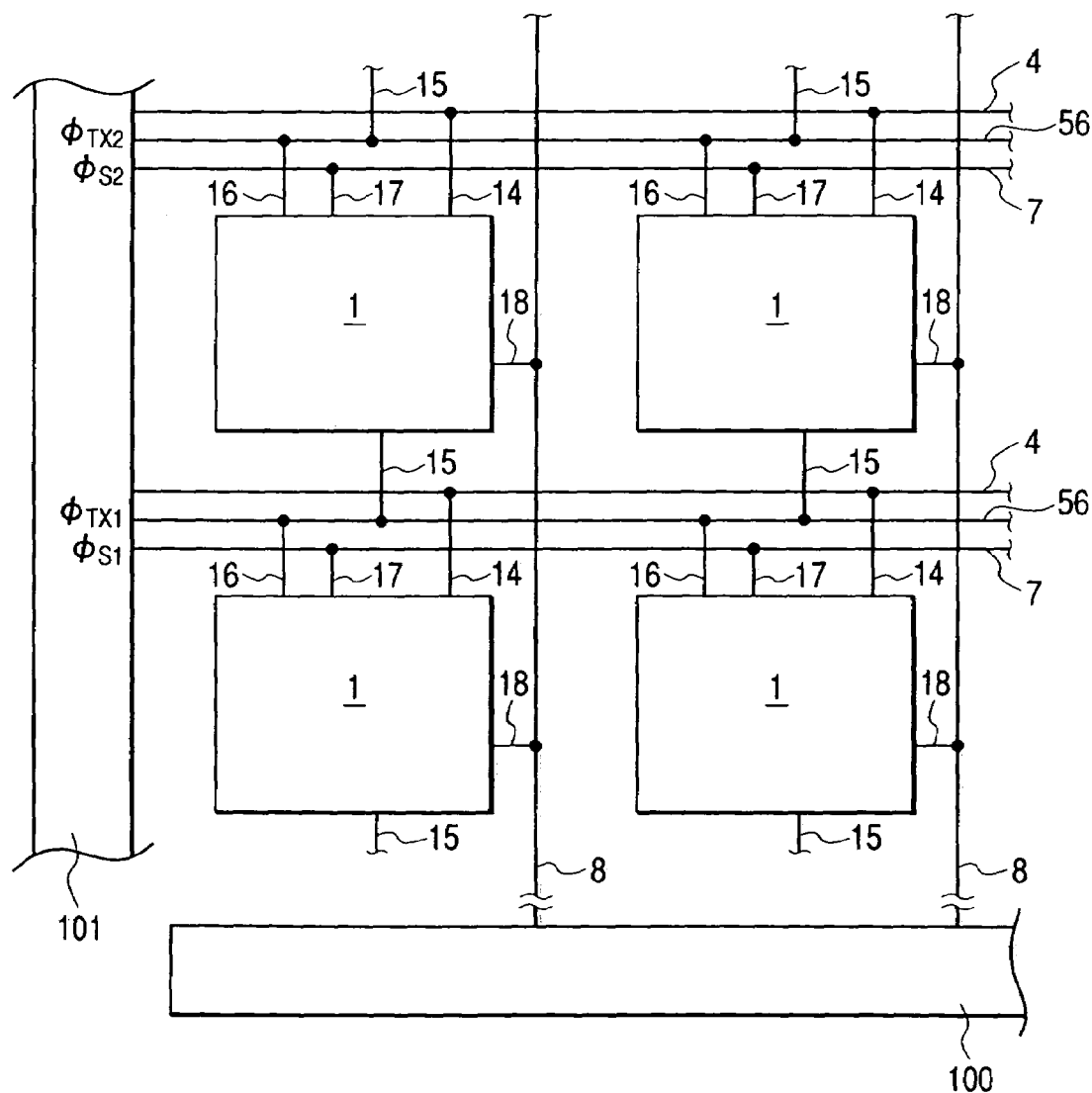
FIG. 11 is a circuit diagram of a solid image pickup device according to still another embodiment of the present invention.

FIG. 9 is a circuit diagram of two unit cells of the solid image pickup device of this embodiment, FIG. 10 is a drive timing chart thereof, and FIG. 11 is a circuit diagram for 2 rows by 2 columns of a solid image pickup device in which unit cells are arranged in a matrix pattern.

In this embodiment, a reset switch line for the n-th row and a transfer switch line for the (n−1)-th row are comprised of one common line. In FIGS. 9 and 11, reference numerals 56 denote a wiring (common line) that are held and used in common between two adjoining rows.

Reference characters Q1(n), Q2(n), Q3(n), and Q4(n) respectively denote a transfer switch, a reset switch, an amplifying transistor, and a selecting switch of a unit cell of an n-th row while Q1(n−1), Q2(n−1), Q3(n−1), and Q4(n−1) respectively denote a transfer switch, a reset switch, an amplifying transistor, and a selecting switch of a unit cell of an (n−1)-th row.

The operation is as follows.

After a unit cell of the (n−1)-th row has been reset, a control pulse φS1 is supplied to the selecting switch line 7 of the (n−1)-th row to turn on the selecting switch Q4(n−1). A control pulse φ22 is supplied to the switch 22 of the signal output line to store a noise signal in the capacity 23. A control pulse φTX1 is input in the controlling common line 56 of the (n−1)-th row so that the transfer switch Q1(n−1) is turned on to transfer an optical signal. A control pulse φ24 is supplied to the switch 24 so that an optical signal containing a noise signal is read out to the capacity 25. Thus, readout of the unit cell of the (n−1)-th row is effected.

When effecting the transfer for the (n−1)-th row, a control pulse φTX1 for resetting the input terminal of the source follower of the unit cell of the n-th row is supplied, which turns on the switch Q2(n) so that the input terminal of the source follower is reset at a reset voltage via the reset switch Q2(n).

In order to read out a noise signal of a unit cell of the n-th row, the reset switch Q2(n) of the pixel of the n-th row is turned on and then off.

Next, the selecting switch line 7 of the n-th row is shifted to a high level with a control pulse φS2 to open the selecting switch Q4(n). This allows the source follower to operate so that the signal output line 8 will be provided with a voltage lower than the reset voltage by a voltage approximately equivalent to the threshold value voltage. The switch 22 is turned on and then off so that the output voltage is written in the holding capacity 23 for noises.

In addition, the transfer switch Q1(n) of the unit cell of the n-th row is turned on and then off with a control pulse φTX2 so that the electric charge inside the photodiode is transferred to the input terminal of the source follower.

The switch 24 is turned on so that an optical signal output containing a noise signal is written in the holding capacity 25 for optical signals.

The configuration and operation of the peripheral circuit 100 are the same as in Embodiment 2, and are as described above.

During the period A2, in order to reset the input terminal of the source follower of the pixel of the n-th row, the reset switch Q2(n) is turned on and the input terminal of the source follower is reset to a reset voltage via the reset switch Q2(n). At this time, the transfer switch Q1(n−1) of the pixel of the (n−1)-th row is simultaneously turned on. The (n−1)-th row was already read out, which means that an electric charge generated by a light for a time period to read out one row will be rejected. When this embodiment is adopted to an area image sensor with a diagonal distance 12.7 mm (½ inch) and 1.6 million pixels for a digital camera, since the number of rows thereof is approximately 1000, the deterioration of the sensitivity when outputting a moving image is merely 0.1%.

In addition, in case of still image shooting with a digital camera, after the readout has been once effected, the subsequent operation will not be affected in any way.

However, during the storage period, the reset switch, which is in dual use as the transfer switch as mentioned above, needs to be kept in off-state, and actually, the reset switch must be turned on in the period A3 immediately before effecting readout.

The manufacturing yield regarding the conventional wiring was approximately 50%, but according to this embodiment it is estimated to rise approximately to 71%.

Embodiment 4

Figure 12:
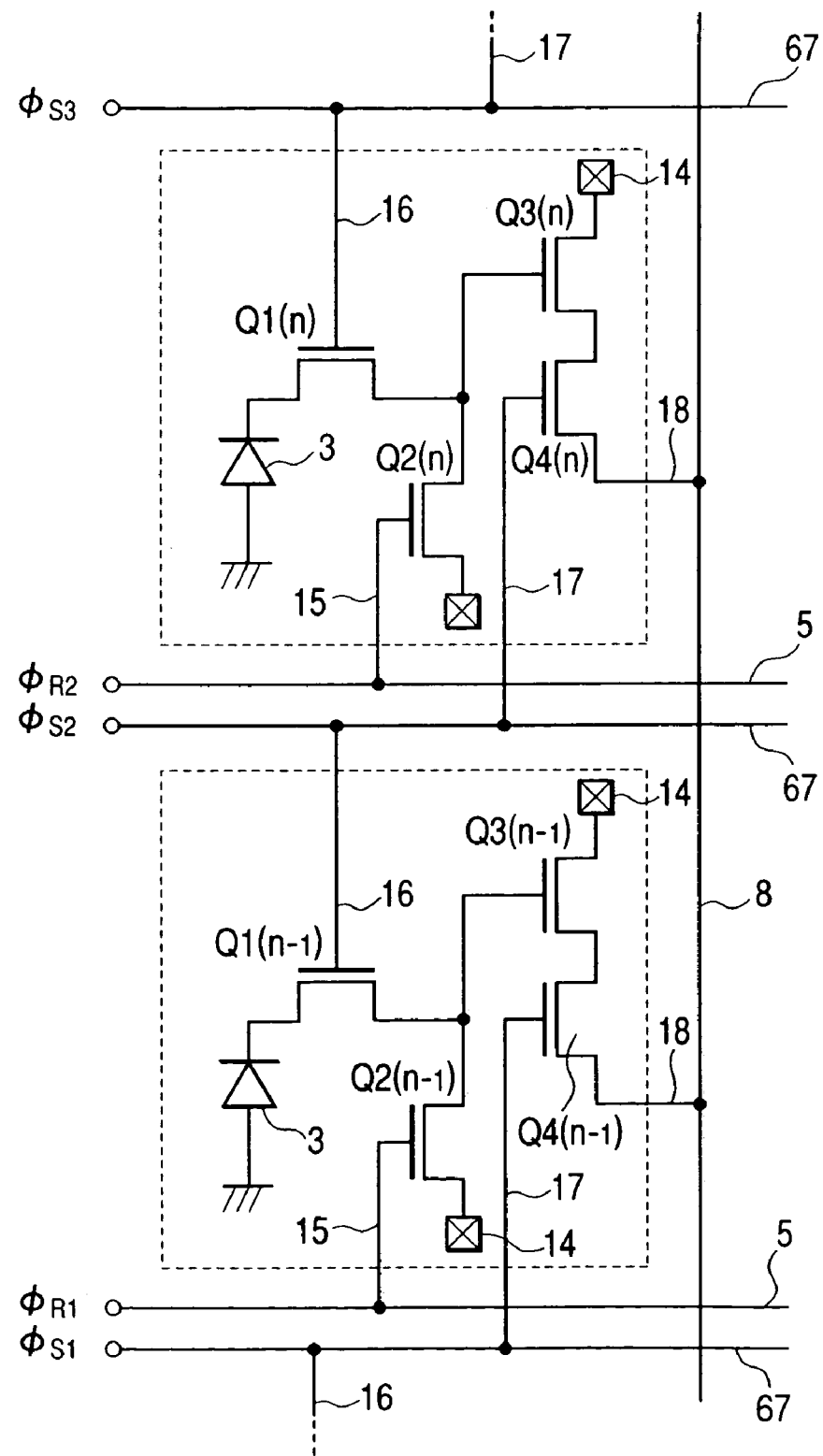
FIG. 12 is a circuit diagram showing a basic configuration of a solid image pickup device according to another embodiment of the present invention.
Figure 13:
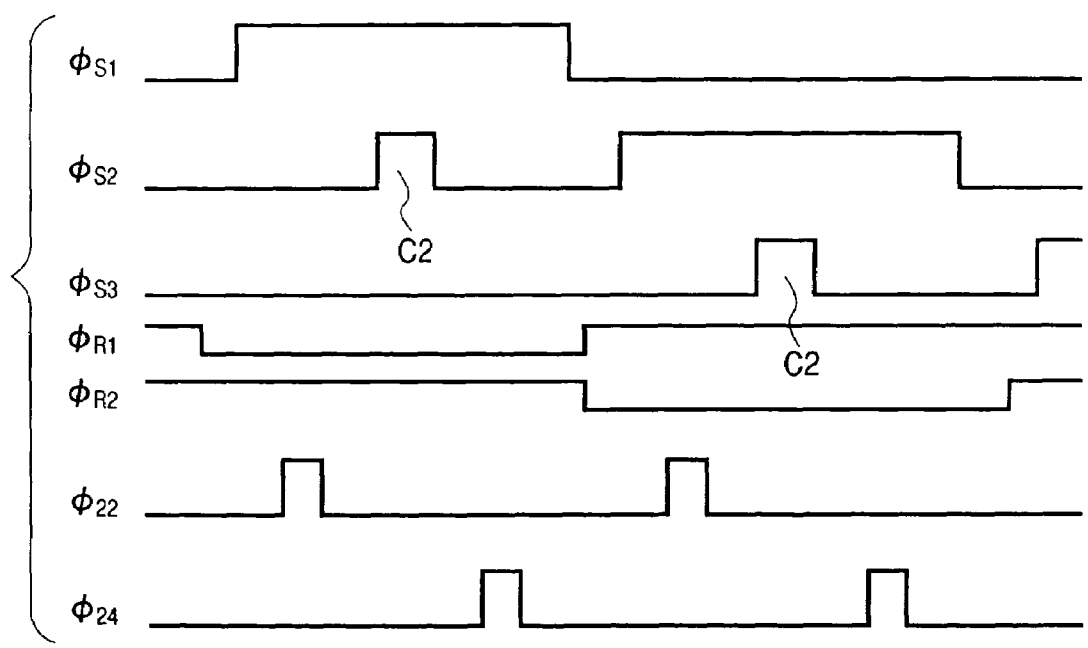
FIG. 13 is a drive timing chart showing a basic operation of the solid image pickup device of FIG. 12.
Figure 14:
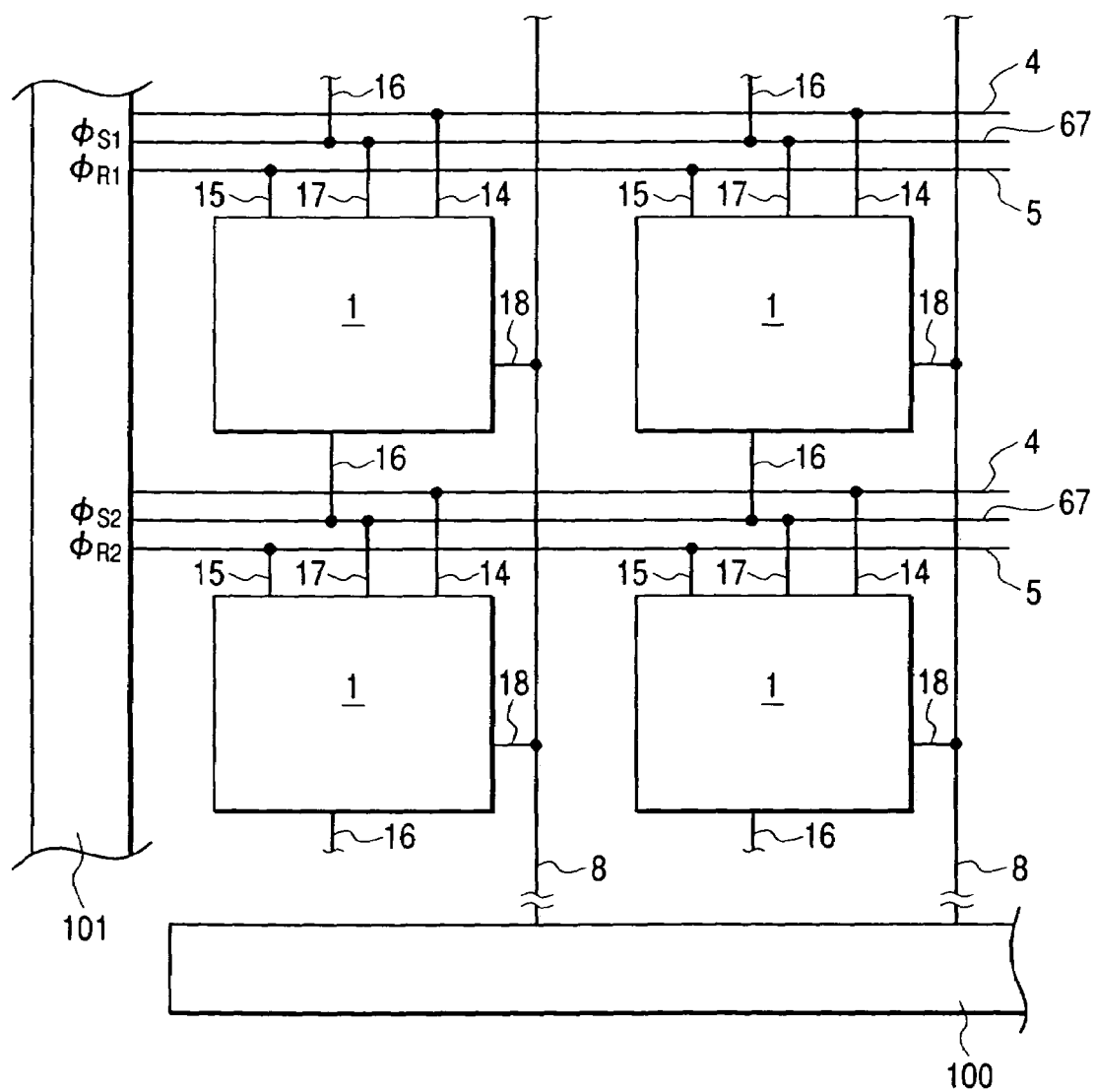
FIG. 14 is a circuit diagram of a solid image pickup device according to another embodiment of the present invention.

FIG. 12 is a circuit diagram of two unit cells of a solid image pickup device of this embodiment, FIG. 13 is a drive timing chart thereof, and FIG. 14 is a circuit diagram for 2 rows by 2 columns of a solid image pickup device in which unit cells are arranged in a matrix pattern. The order of arrangement of unit cells to be selected in time series fashion is upside down in FIGS. 12 and 14, but there will be no difference in operation.

This embodiment has a selecting switch line for an n-th row and a transfer switch line for an (n−1)-th row comprised of one common line. In FIG. 12, reference numerals 67 denote a wiring (common line) that are held and used in common between the unit cell of the n-th row and the unit cell of the (n−1)-th row. Reference characters Q1(n), Q2(n), Q3(n), and Q4(n) respectively denote a transfer switch, a reset switch, an amplifying transistor, and a selecting switch of the n-th row while Q1(n−1), Q2(n−1), Q3(n−1), and Q4(n−1) respectively denote a transfer switch, a reset switch, an amplifying transistor, and a selecting switch of (n−1)-th row. Reference numeral 5 denote a reset control line.

The operation is as follows.

After a unit cell of the (n−1)-th row has been reset with a control pulse φR1, a control pulse φS1 is supplied to the selecting switch line 67 of the (n−1)-th row to turn on the selecting switch Q4(n−1). A control pulse φ22 is supplied to the switch 22 of the signal output line so that the noise signal of the (n–1)-th row is stored in the capacity 23. A control pulse φS2 is input into the controlling common line 67 of the n-th row so that the transfer switch Q1(n–1) is turned on to transfer the optical signal. A control pulse φ24 is supplied to the switch 24 so that an optical signal containing a noise signal of the (n–1)-th row is read out to the capacity 25. Thus, readout of the unit cell of the (n–1)-th row is effected.

When effecting the transfer for the (n–1)-th row, a control pulse φS2 is supplied to the selecting switch of the unit cell of the n-th row, which turns on the switch Q4(n), but the output in this state is not held, there are no operational problems.

In order to read out the noise signal of a unit cell of the n-th row, the reset switch Q2(n) of the pixel of the n-th row is turned on and then off with a control pulse φR2.

Next, when a control pulse φS2 is raised to a high level, the control line 67 of the n-th row is shifted to a high level so that the selecting switch Q4(n) is turned on. This allows the source follower to operate so that the signal output line 8 will be provided with a voltage lower than the reset voltage by a voltage approximately equivalent to the threshold value voltage. Again, the switch 22 is turned on and then off so that the output voltage of the unit cell of the n-th row is written into the holding capacity 23 for noises.

In addition, the transfer switch Q1(n) of the unit cell of the n-th row is turned on and then off with a control pulse φS3 so that the electric charge inside the photodiode is transferred to the input terminal of the source follower.

The switch 24 is turned on so that the output containing an optical signal (containing a noise signal) of the n-th row is written into the holding capacity 25 for optical signals. When the selecting switch Q4(n) of the n-th row is turned on, the transfer switch Q1(n–1) of the (n–1)-th row is simultaneously turned on. The (n–1)-th row has been already read out, which means that an electric charge generated by the light for a time period to read out one row will be rejected, but as described above, there arise no problems.

The configuration and operation of the peripheral circuit 100 are the same as in Embodiment 2, and are as described above.

The manufacturing yield regarding the conventional wiring was approximately 50%, but according to this embodiment it is estimated to rise approximately to 71%.

Embodiment 5

Figure 15:
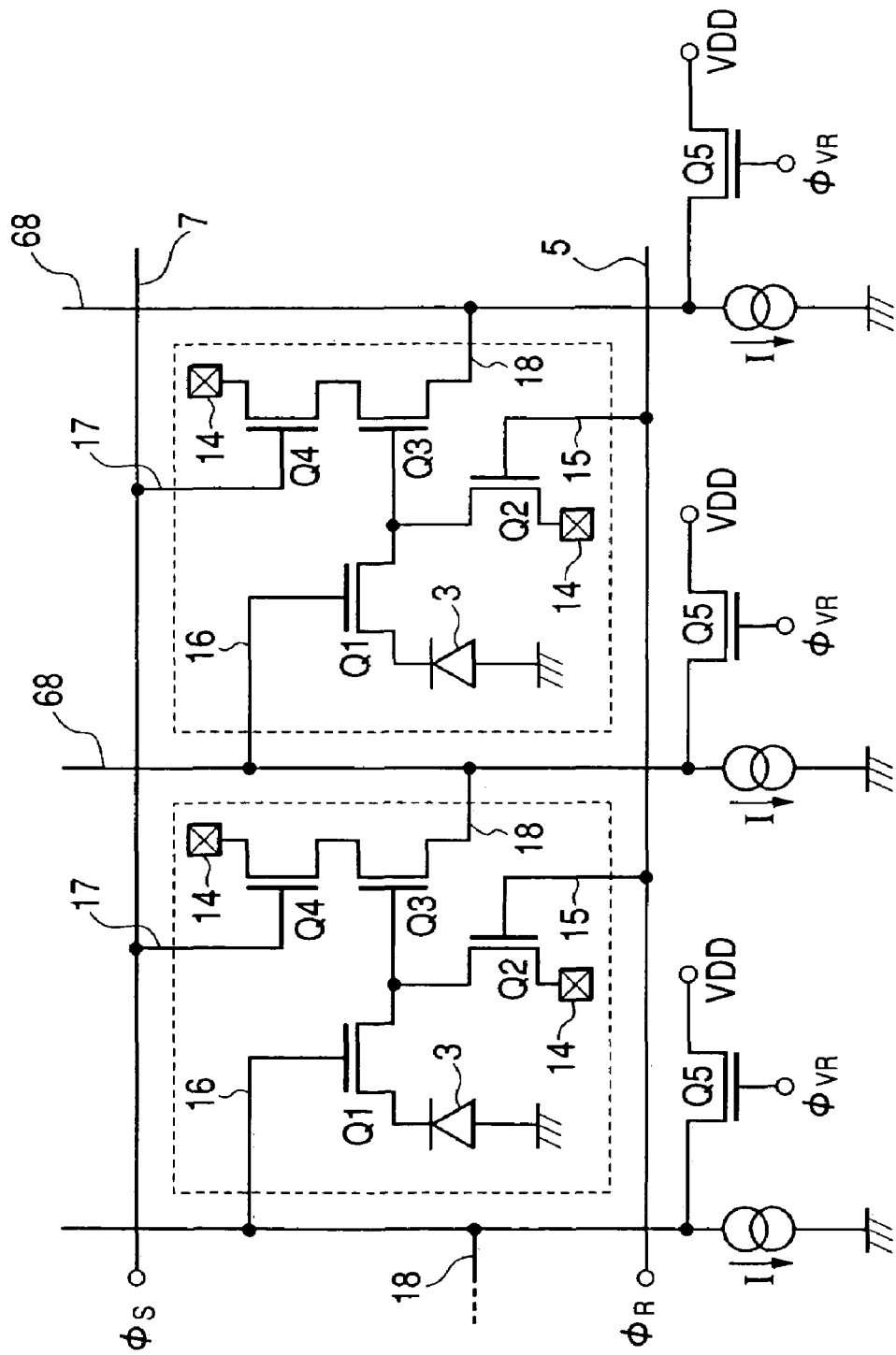
FIG. 15 is a circuit diagram showing a basic configuration of a solid image pickup device according to still another embodiment of the present invention.
Figure 16:
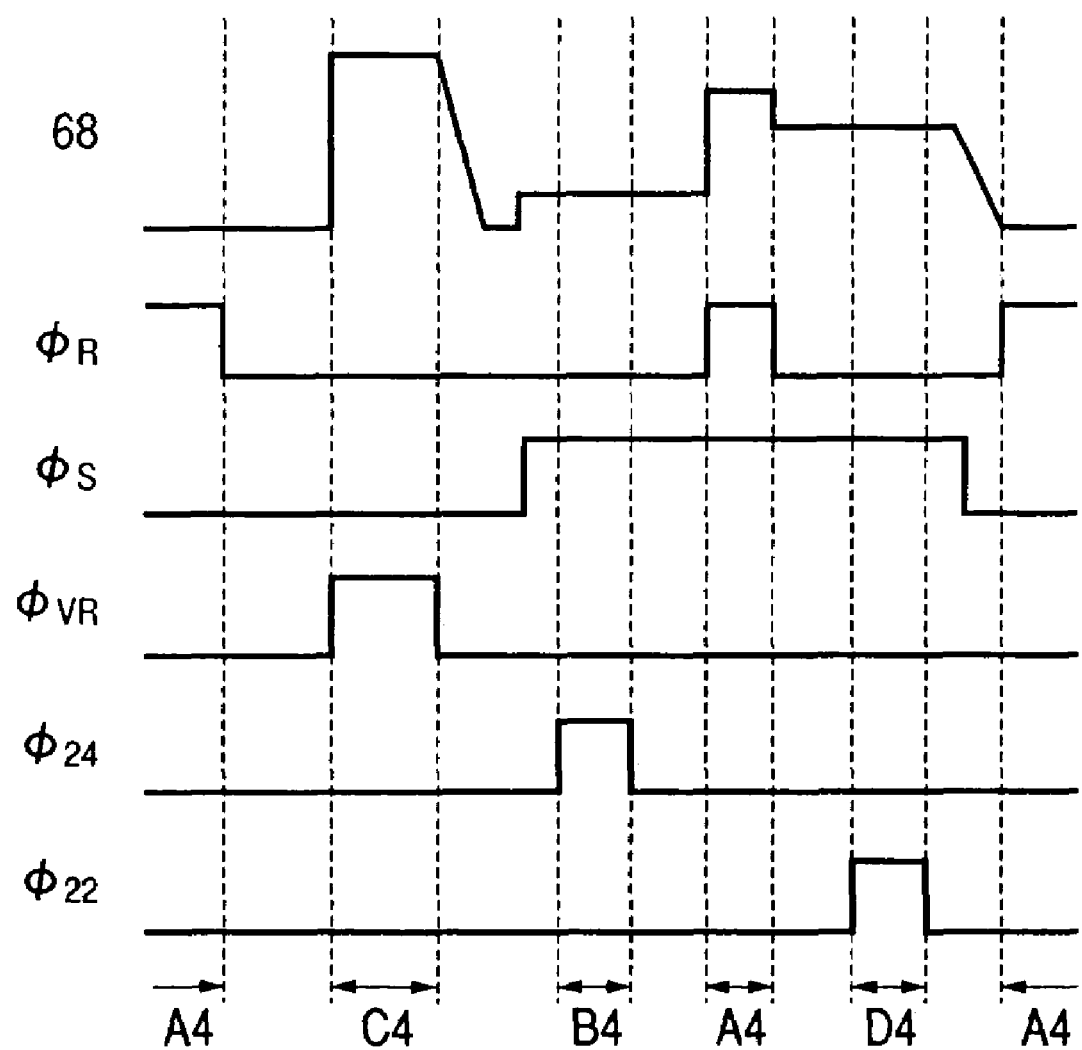
FIG. 16 is a drive timing chart showing a basic operation of the solid image pickup device of FIG. 15.
Figure 17:
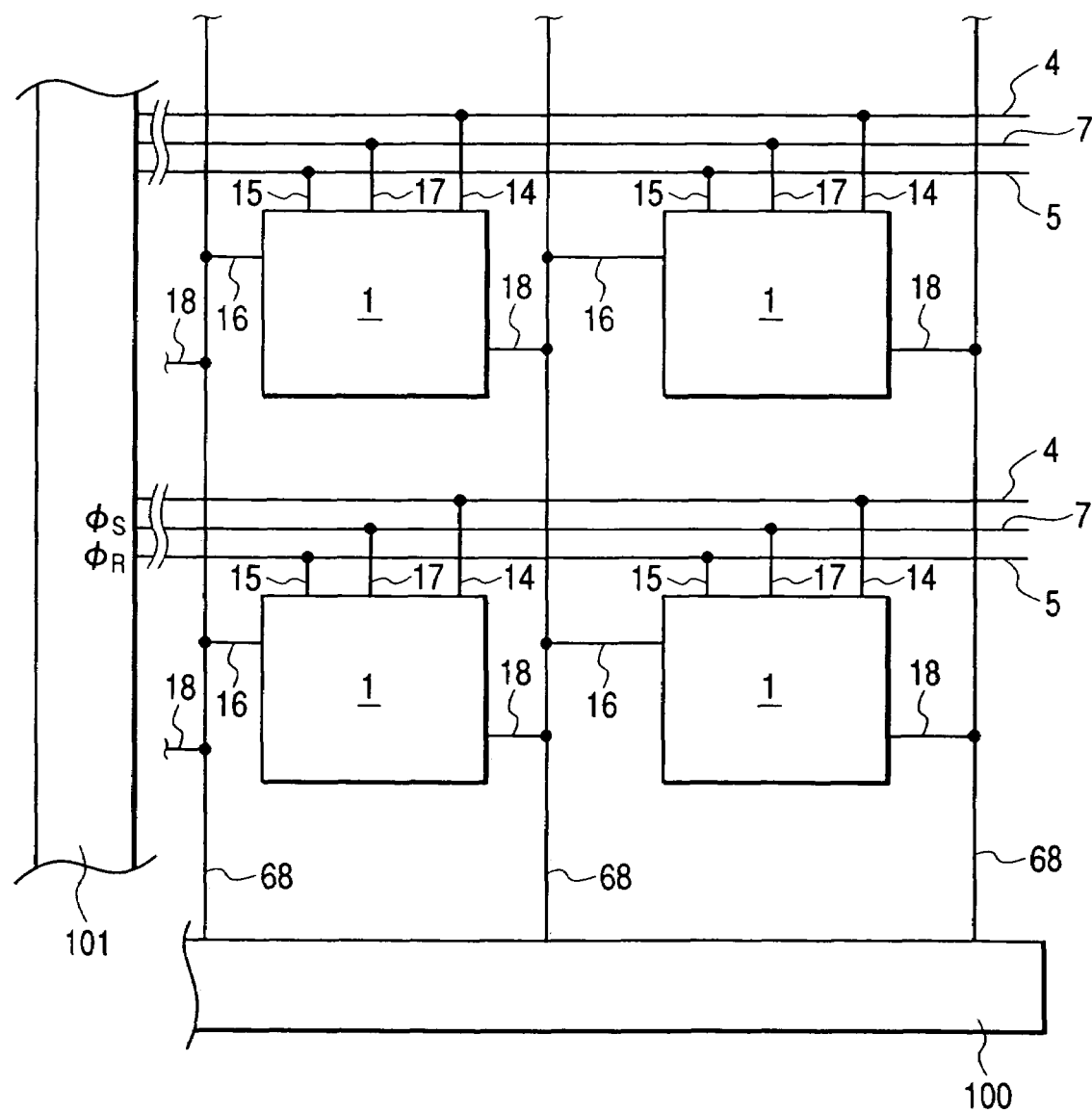
FIG. 17 is a circuit diagram of a solid image pickup device according to still another embodiment of the present invention.

FIG. 15 is a circuit diagram of two unit cells of a solid image pickup device of this embodiment, FIG. 16 is a drive timing chart of a unit cell of a row, and FIG. 17 is a circuit diagram for 2 rows by 2 columns of a solid image pickup device in which unit cells are arranged in a matrix pattern.

This embodiment has a vertical signal output line and a transfer switch line comprised of one line commonly held between adjoining pixels of the same row. The common line denoted by reference numeral 68 has multi-functions both as a transfer switch line and a signal output line, and all the pixels will be subjected to the transfer at a time. Accordingly, this embodiment is suitably used for a system in which the storage period is defined with a mechanical shutter and the electric charge is transferred with regard to all the pixels at a time.

Figure 31:
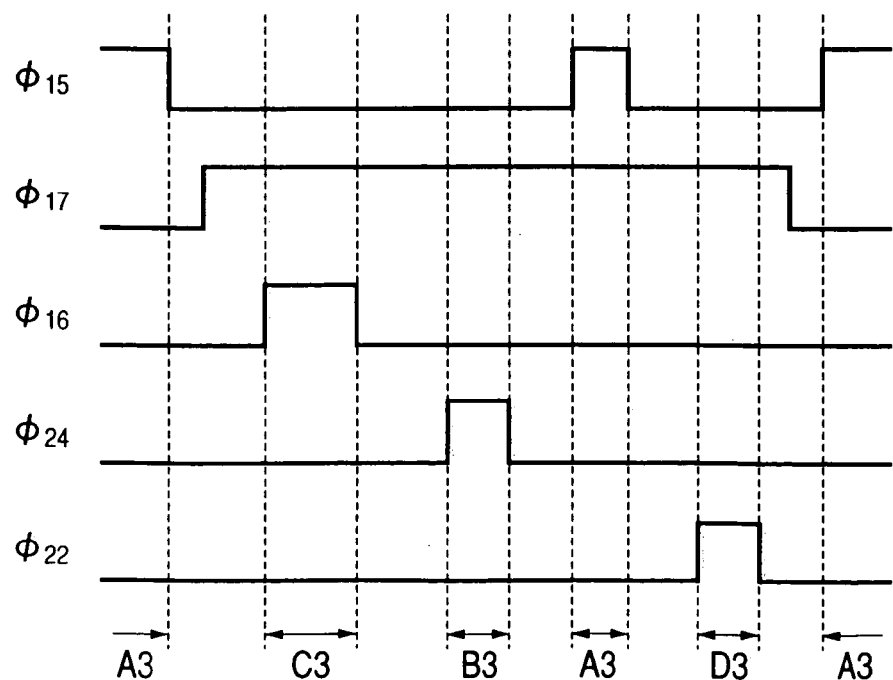
FIG. 31 is a view showing another example of drive timing of a solid image pickup device.

The readout system is such as shown in FIG. 31, in which an optical signal output is read out and thereafter the input terminal is reset, the reset signal is read out, and subtraction is carried out between the both signals.

Consequently, although the heat noise at the time of resetting cannot be removed, the OFFSET noise as large as several tens to several hundreds mV resulting from dispersion of the threshold values of amplifying transistors Q3 can be removed.

During a period A4 shown in FIG. 16, in order to reset an input terminal of the source follower, a control pulse φR is supplied to turn on the switch Q2. At this time, the input terminal of the source follower is reset to a reset voltage via the reset switch Q2.

After the reset switch Q2 is turned off, during the period C4, in order to transfer electric charge for all the unit cells from the photodiode to the input terminal of the source follower at a time, and in order to turn on the transistor Q5 and to turn on the transfer switch Q1, the potential of the signal output line 68 is raised to a high level.

Thereafter, the optical signal is read out for each row.

After a predetermined row is selected with a control pulse φS, during the period B4, the output containing an optical signal is written into the holding capacity 25 for optical signals.

Next, in order to read out a noise signal such as reset noise, during the period A4 subsequent to the period B4, the reset switch Q2 on only the selected row is turned on and then off so that the reset operation is implemented. Next, during the period D4, the output voltage after this reset operation is written into the holding capacity 23 for noises.

Thereafter, by use of the horizontal scanning circuit 26, the signals written into the holding capacities are read out into the horizontal output lines, and the differential amplifier is used to output a difference between the both signals. Hereby, although the heat noise at the time of resetting cannot be removed, a good signal can be obtained from which the OFFSET noise as large as several tens to several hundreds mV resulting from dispersion of threshold values of transistors Q3 has been removed.

Further, the manufacturing yield regarding the conventional wiring was approximately 50%, but according to this embodiment it is estimated to rise approximately to 70%.

Embodiment 6

Figure 18:
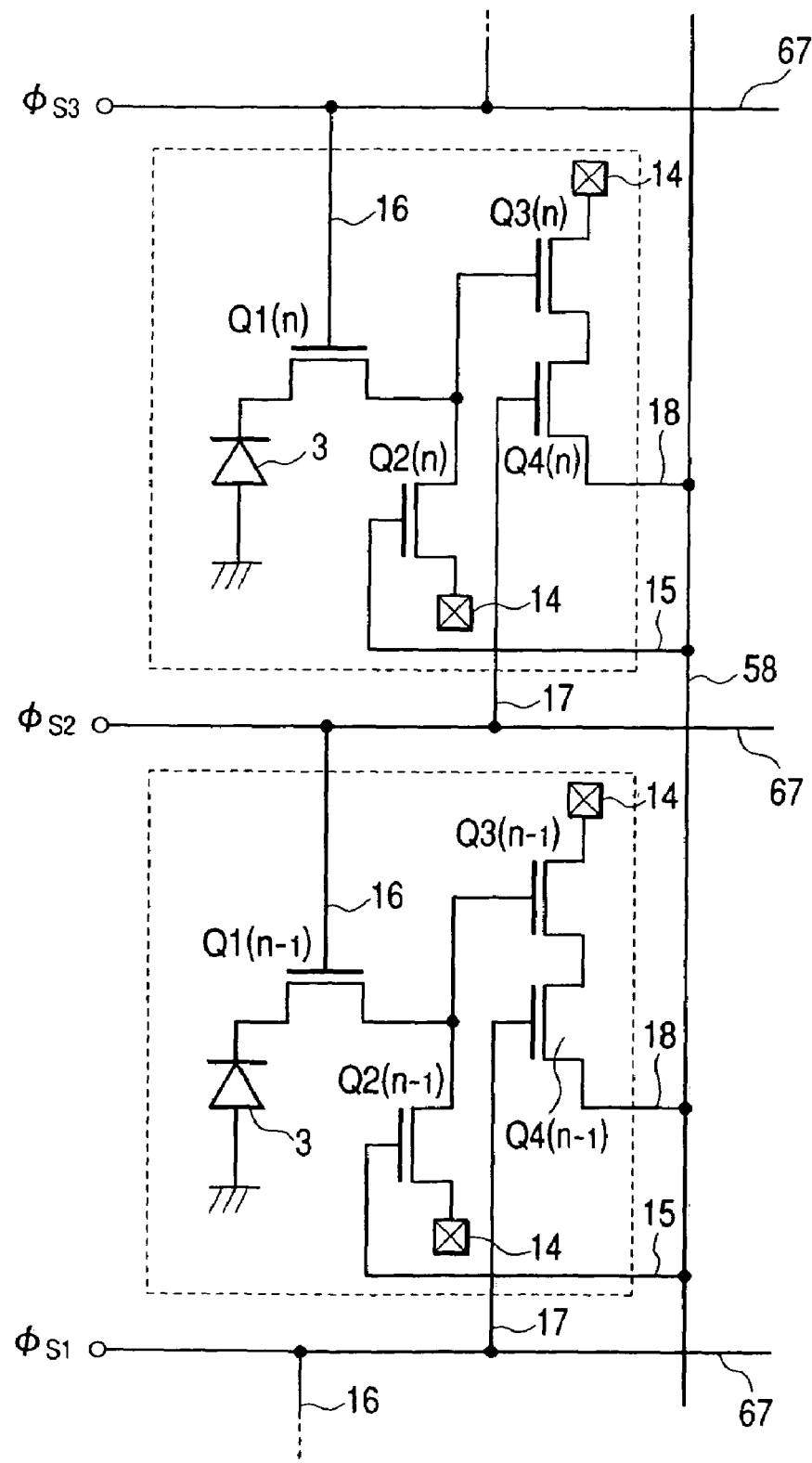
FIG. 18 is a circuit diagram showing a basic configuration of another solid image pickup device according to an embodiment of the present invention.
Figure 19:
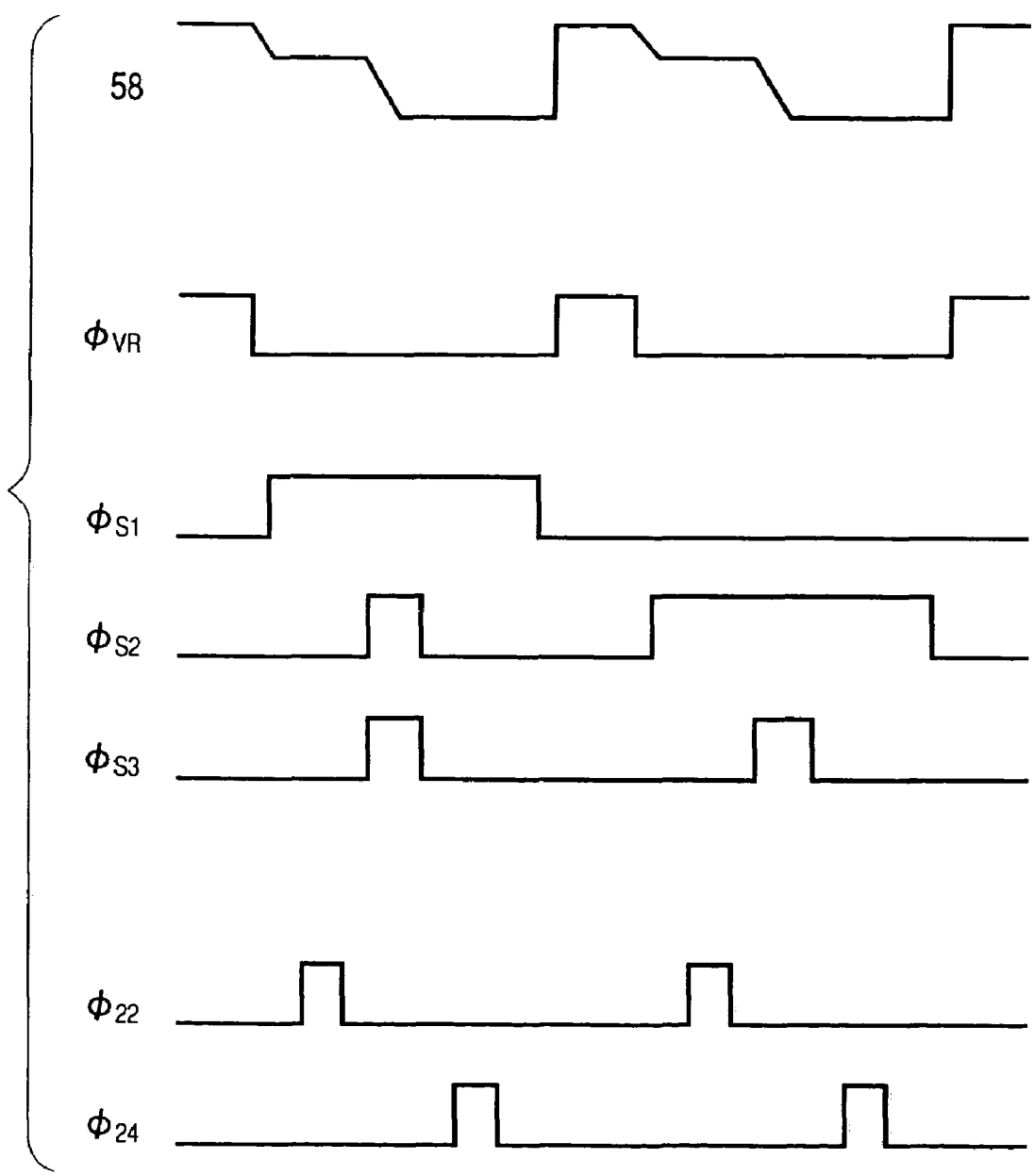
FIG. 19 is a drive timing chart showing a basic operation of the solid image pickup device of FIG. 18.
Figure 20:
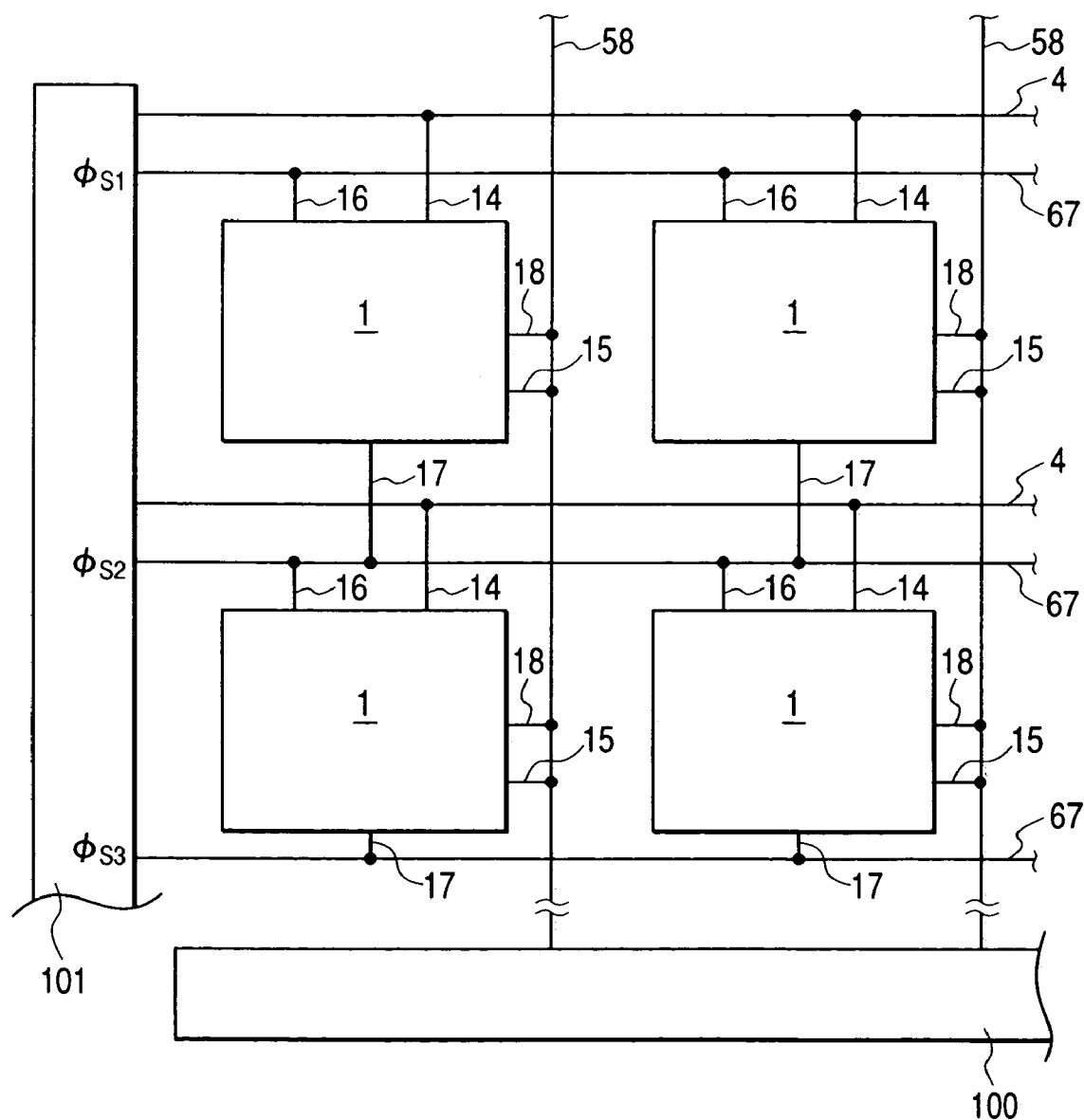
FIG. 20 is a circuit diagram of another solid image pickup according to an embodiment of the present invention.

FIG. 18 is a circuit diagram of two unit cells of this embodiment, FIG. 19 is a drive timing chart of a unit cell of two rows, and FIG. 20 is a circuit diagram for 2 rows by 2 columns of a solid image pickup device in which unit cells are arranged in a matrix pattern.

This embodiment has a selecting switch line of an n-th row and a transfer switch line of an (n–1)-th row comprised of one common line and also has a signal output line and a reset switch line comprised of other one common line. A first common line 58 functions as both of the signal output line and a reset switch line and a second common line 67 has multi-functions of selection control of the n-th row and of transfer control of the (n–1)-th row.

The operation is the same as in Embodiment 4, and the respective operations are compatible with each other as described in Embodiments 1 and 4.

During a period A1 shown in FIG. 19, the switch Q5 is turned on with a control pulse φVR, and a high level voltage is applied to the signal output line 58. At this time, the input terminals of all the source followers are reset at a reset voltage via the reset switches Q2.

Next, the switch Q5 is turned off with a control pulse φVR. Moreover, with a control pulse φS1, a high level voltage is applied to the selecting switch line 67 of the (n–1)-th row to turn on the selecting switch Q4(n–1). As a consequence hereof, the signal output line 58 is lowered to a low voltage by a constant-current load 21 of the source follower. At this time, the source follower operates and a voltage appearing in the signal output line 58 will become a voltage that has dropped from the reset voltage by a voltage equivalent to the threshold value voltage. The switch 22 is turned on and then off with a control pulse φ22, and the output voltage is written into a holding capacity 23 for noise signals as shown in FIG. 29 (period B1). At this time, the gate voltage of the reset switch Q2 will become lower by a voltage equivalent to the threshold value voltage than the source voltage of the reset switch Q2, so that the reset switch Q2 will be turned off.

During the period C1, the transfer switch Q1(n-1) is turned on and then off with a control pulse φS2 to transfer an electric charge inside the photodiode 3 to the input terminal of the source follower. At this time, the voltage of the signal output line 58 drops depending on the quantity of electric charge. At this point of time, the reset switch Q2 remains in off-state.

During the period D1, the switch 24 is turned on and then off with a control pulse φ24, so that an output containing an optical signal is written into the holding capacity 25 for optical signals.

Again, in order to reset the input terminal of the source follower, the switch Q5 is turned on with a control pulse φVR, and the voltage of the output signal line 58 is increased to such a voltage as to turn on the reset switch Q2.

Thereafter, by use of the horizontal scanning circuit, the signals written into the holding capacities are read out into the horizontal output lines, and the differential amplifier is used to take a difference between the both signals. Hereby, a signal with a low noise equal to conventional one can be obtained.

Further, while the manufacturing yield regarding the conventional wiring was approximately 50%, according to this embodiment it is estimated to rise approximately to 82%.

As in this embodiment, combination of the above described embodiments can realize further reduction of number of wirings (lines), improve the wiring yield, and reduce the area occupied by wiring (lines) to improve the numerical aperture.

Embodiment 7

Figure 21:
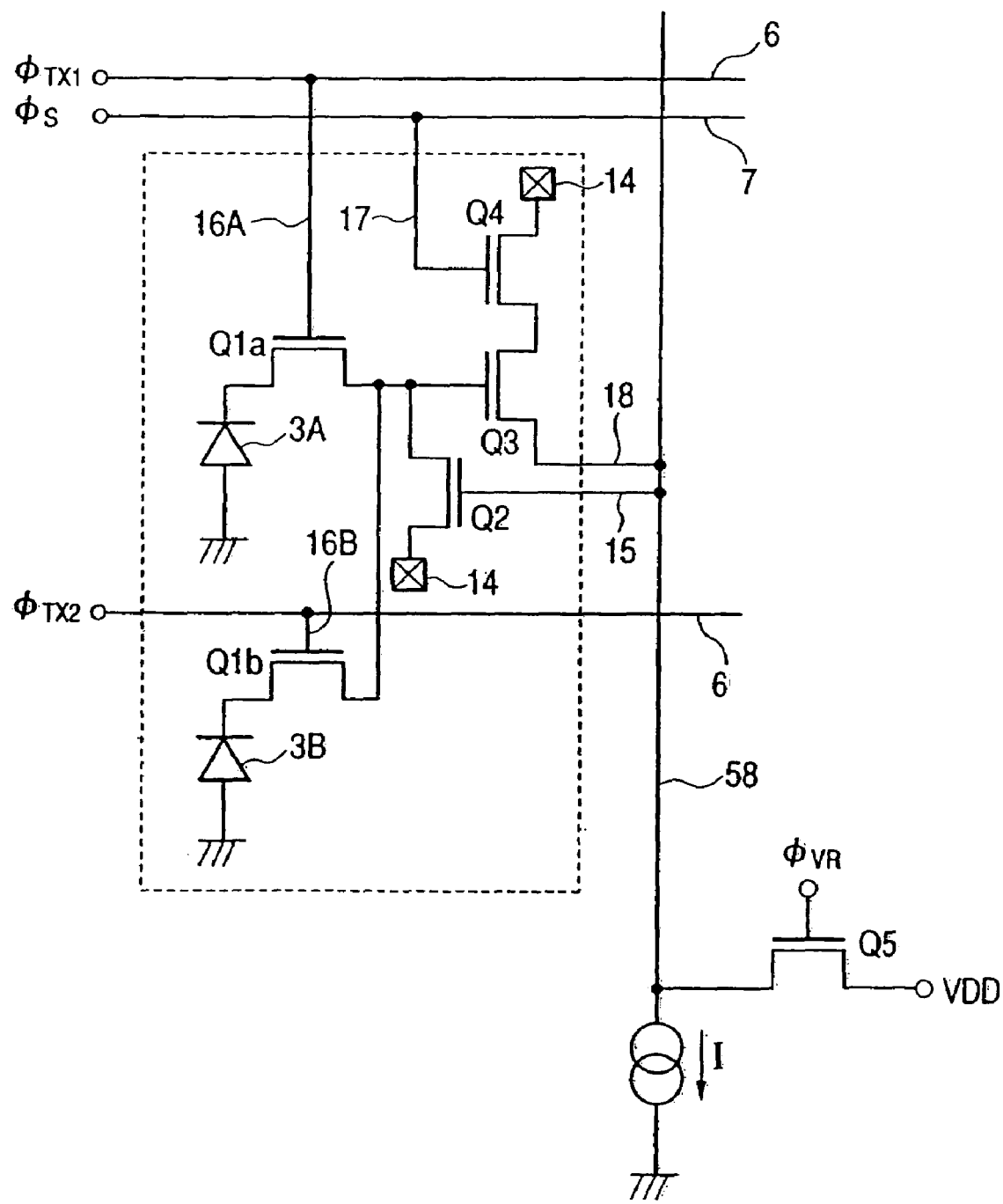
FIG. 21 is a circuit diagram showing a basic configuration of still another solid image pickup device according to an embodiment of the present invention.
Figure 22:
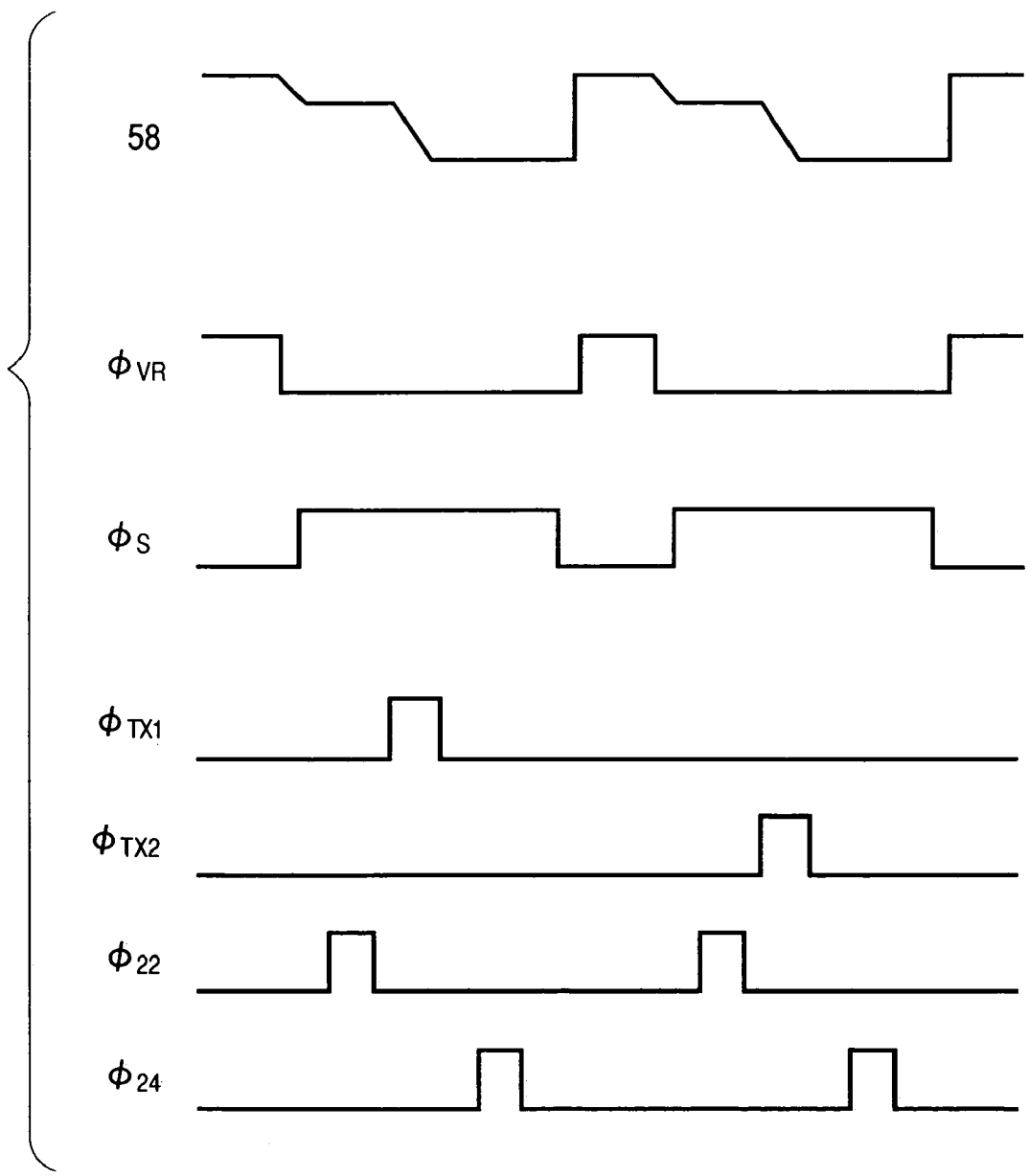
FIG. 22 is a drive timing chart showing a basic operation of the solid image pickup device of FIG. 21.
Figure 23:
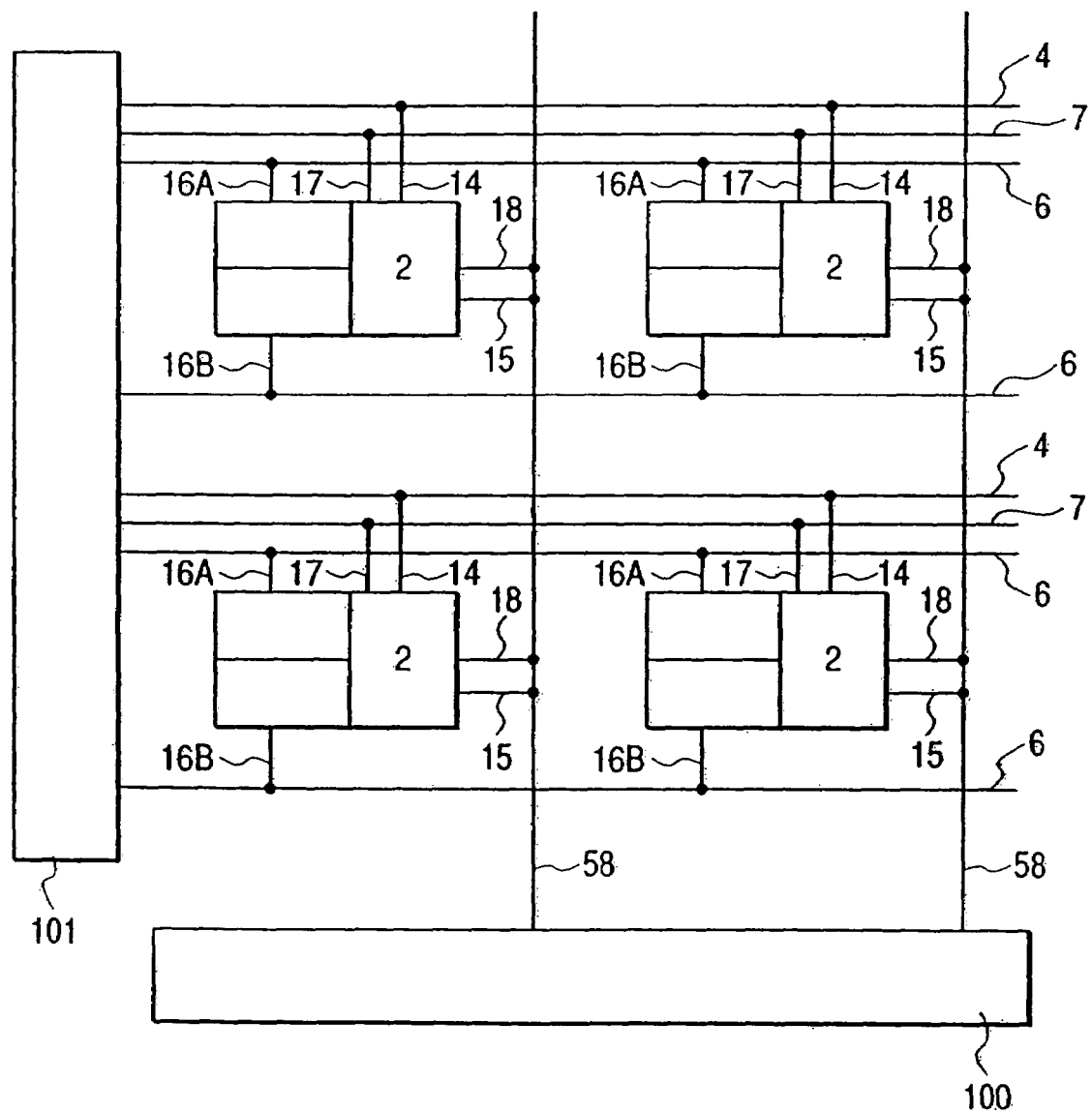
FIG. 23 is a circuit diagram of still another solid image pickup device according to an embodiment of the present invention.

This embodiment shown in FIG. 21 is a modification of Embodiment 1 wherein one output portion 2 comprising one source follower for signal amplification and a reset switch is disposed with regard to two photoelectric conversion portions and transfer switches. FIG. 22 is a drive timing chart thereof. FIG. 23 is a circuit diagram for a matrix of 2 rows by 2 columns of a solid image pickup device in which unit cells shown in FIG. 21 are arranged. In this embodiment, since a unit cell has two photoelectric conversion portions, one unit cell corresponds to two pixels. Therefore, in FIG. 22, there are four rows by four columns on the basis of number of pixels.

An outline of operation of this solid image pickup device is as follows.

After the output signal line 58 and the input portion of amplifying transistors have been reset with a control pulse φVR, the selecting switch Q4 is turned on with a control pulse φS.

After a noise signal has been read out with a control pulse φ22, the transfer MOS switch Q1a is turned on with a control pulse φTX1 to transfer an electric charge of the photodiode 3A via the transfer MOS switch Q1a so that the optical signal is read out with a control pulse φ24.

Likewise, after reset followed by readout of a noise signal, a control pulse φTX2 is turned on, and the transfer MOS switch Q1b is turned on to transfer an electric charge of the photodiode 3B via the transfer MOS switch Q1b so that the optical signal is read out with a control pulse φ24.

According to this embodiment, since the quantity of reset switches, selecting switches, and selecting switch lines will be reduced to a half, further improvement in yield is estimated.

Embodiment 8

Figure 24:
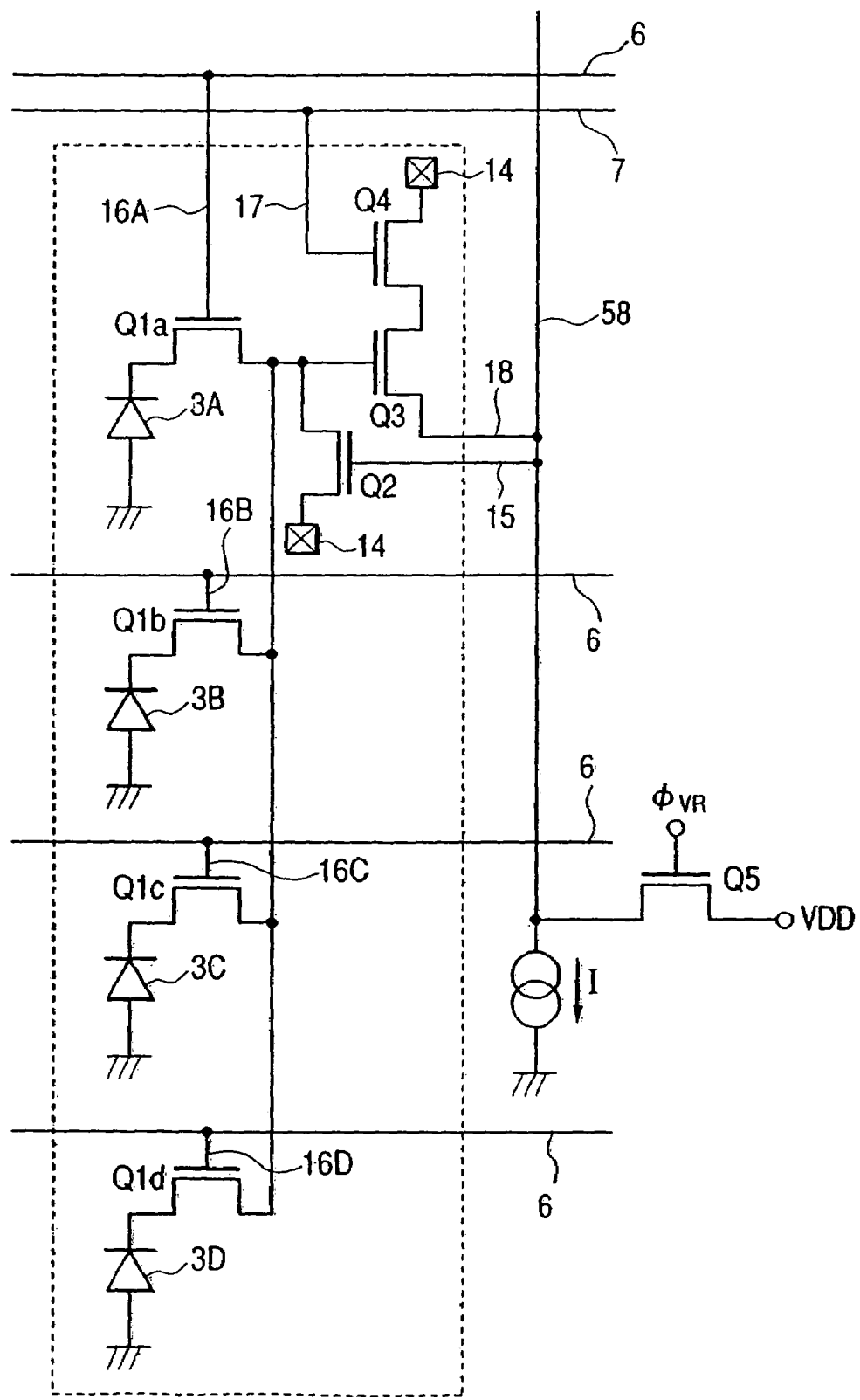
FIG. 24 is a circuit diagram showing a basic configuration of still another solid image pickup device according to an embodiment of the present invention.

This embodiment shown in FIG. 24 is a modification of Embodiment 7 in which one output portion comprising one source follower for signal amplification and a reset switch is disposed with regard to four photoelectric conversion portions and transfer switches. That is, one unit cell corresponds to four pixels.

An outline of operation of this solid image pickup device is as follows.

As in Embodiment 7, after a signal of the photoelectric conversion portion of the n-th row has been read out with the transfer switches Q1a, Q2, Q3, and Q4, a signal of the photoelectric conversion portion of the "n+1"-th row is read out with the transfer switches Q1b, Q2, Q3, and Q4. Such operations are repeated four times in total.

According to this embodiment, since the quantity of reset switches, selecting switches, and selecting switch lines will be reduced to a quarter as compared with Embodiment 1, further improvement in manufacturing yield is estimated.

Embodiment 9

Figure 25:
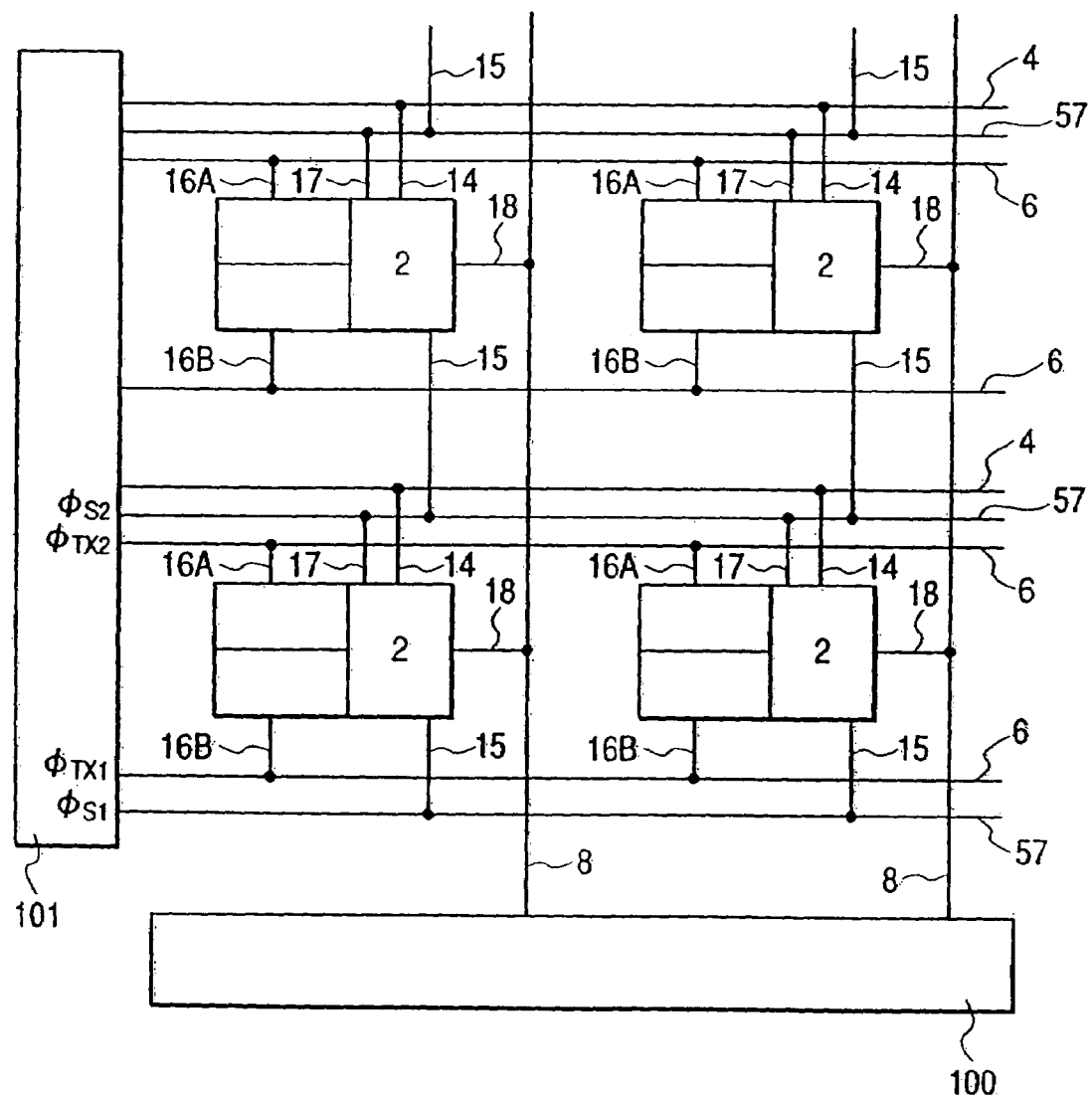
FIG. 25 is a circuit diagram showing another basic configuration of a solid image pickup device according to an embodiment of the present invention.
Figure 26:
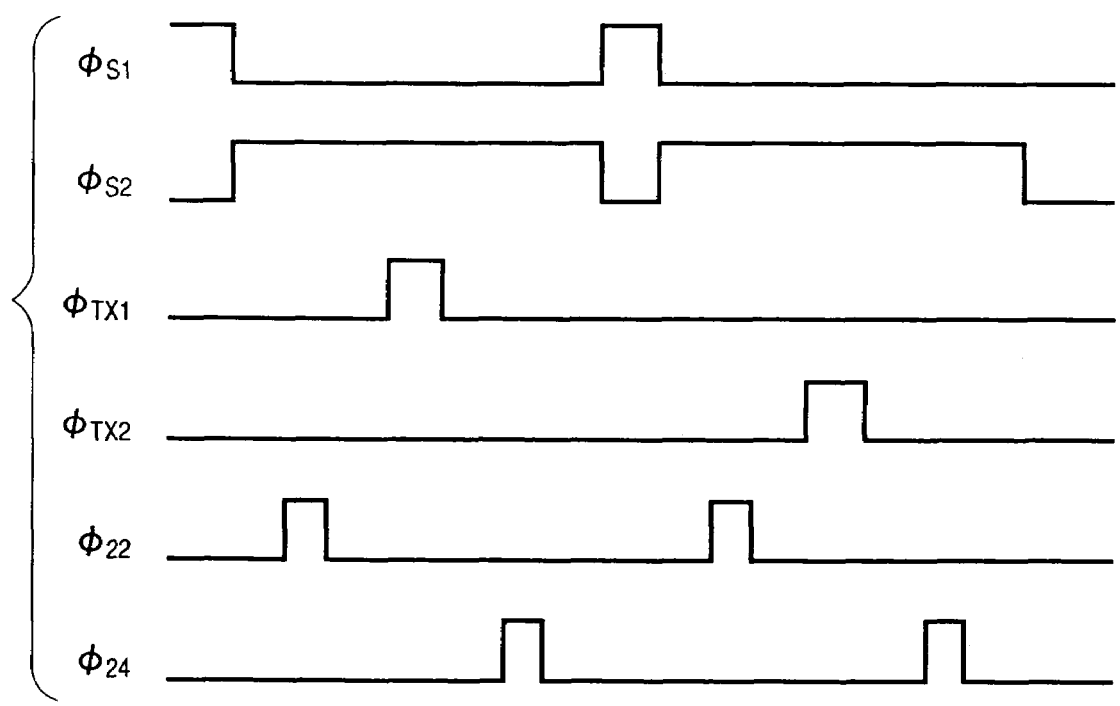
FIG. 26 is a drive timing chart showing a basic operation of the solid image pickup device of FIG. 25.

This embodiment shown in FIG. 25 is configured by comprising electrodes for resetting in Embodiment 7 connected to the selecting switch line of an adjacent row. A drive timing chart thereof is shown in FIG. 26. The driving timing shown in FIG. 26 is for implementing selection from lower rows to upper rows.

An outline of operation of this solid image pickup device is as follows.

The unit cell of the preceding row is reset with a control pulse φS1. The selecting switch of the output portion 2 is turned on with a control pulse φS2, and a noise signal is read out with a control pulse φ22. Subsequently, an electric charge of the photodiode 1B is transferred with a control pulse φTX1, and an optical signal is read out with a control pulse φ24.

Again, the unit cell of the preceding row is reset with a control pulse φS1, the selecting switch of the output portion 2 is turned on with a control pulse φS2, and a noise signal is read out with a control pulse φ22. Then, an electric charge of the photodiode 1A is transferred with a control pulse φTX2, and an optical signal is read out with a control pulse φ24.

In the next row, a control pulse φS2 implements resetting, and the operation described above is continued.

As the amplifying means, transfer means, and reset means used in the present invention, n-channel or p-channel MOS transistors are included.

As the photoelectric conversion portion of the present invention, in addition to a photodiode, a photogate of a MOS structure can be used, but a buried photodiode is more preferably adopted.

As the transfer means used in the present invention, a transfer gate of a MOS structure or a MOS transistor is mentioned.

In addition, an opposite conductivity type of the transistors may be adopted, and at this time, it is needless to say that a high level or a low level, etc. of a control pulse is reversed from those of the above embodiments depending on the operation.

As a preferable embodiment, it is preferable to use such a structure that the cathode of a photodiode and the n-type source and drain of each transistor are built in a p-type well, for a unit cell.

FIG. 33 is a schematic sectional showing an example of such a unit cell, in which a photodiode, a transfer means, and a reset means are shown. Reference numeral 81 denotes a p-type well, reference numeral 82 denotes an oxide film as an element-separating region, reference numeral 83 denotes a cathode of a photodiode, reference numerals 84 and 85 denote respectively a drain and a source of an n-channel MOS transistor as a reset means, and the drain 84 is connected to the input terminal of the amplifying means and the source 85 is connected to the power line for resetting. Reference numerals 86 and 87 denote gate electrodes. Although not shown, n-channel MOS as an amplifying means and a selecting means are likewise built in the p-type well 81. Thus, each element configuring a unit cell comprises the same conductivity type element with electrons being used as transmission carriers. Reference numeral 88 denotes a p-type layer. With the conductivity type being made opposite in FIG. 33, elements using holes as transmission carriers can be used for configuration.

In addition, the selection control line, the transfer control line, the reset control line, and the signal output line, etc. are comprised of a conductive material formed on an insulating layer of a semiconductor substrate, and are preferably comprised of a metal such as Al, AlSi, AlCu, AlSiCu, Cu, etc.

Figure 27:
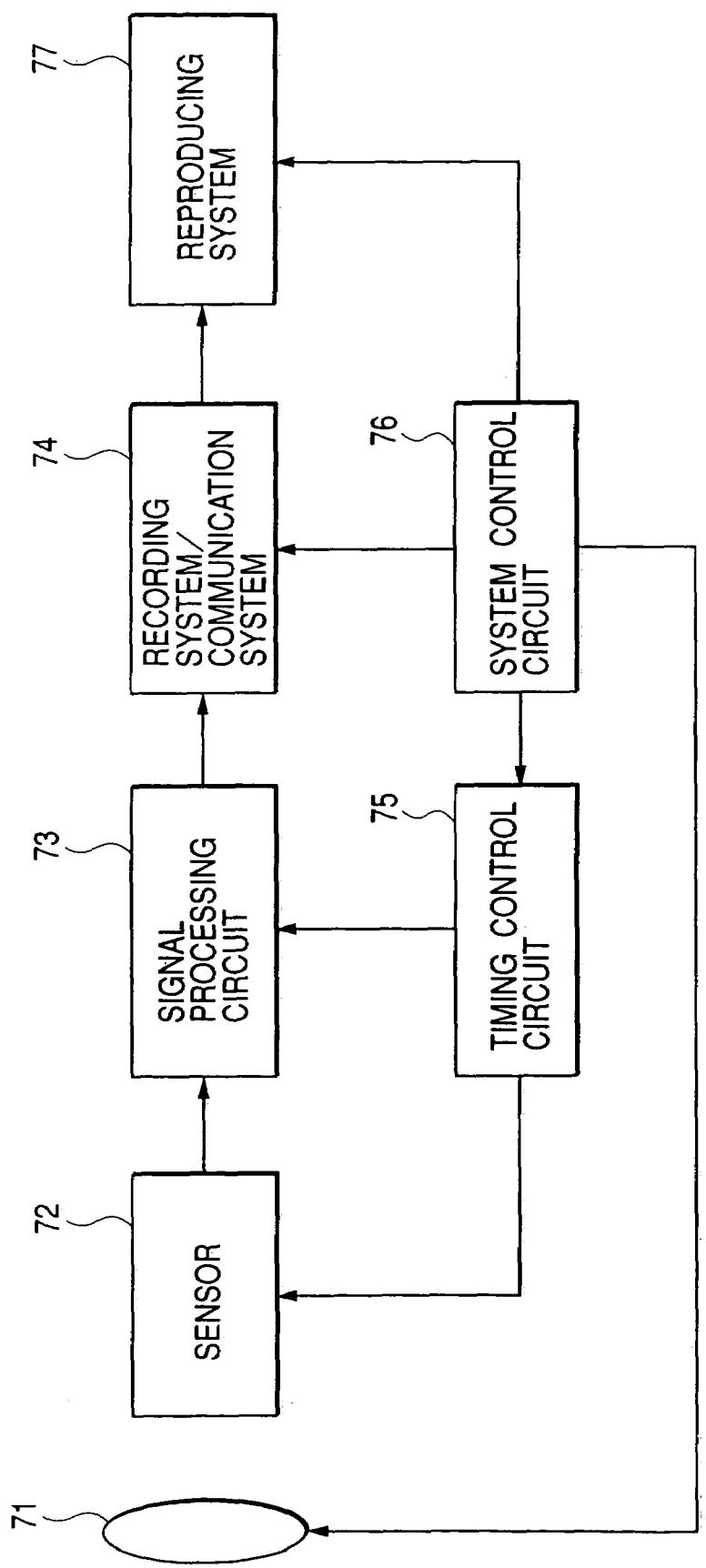
FIG. 27 is a block diagram showing a configuration of a solid image pickup system according to the present invention.
Figure 28:
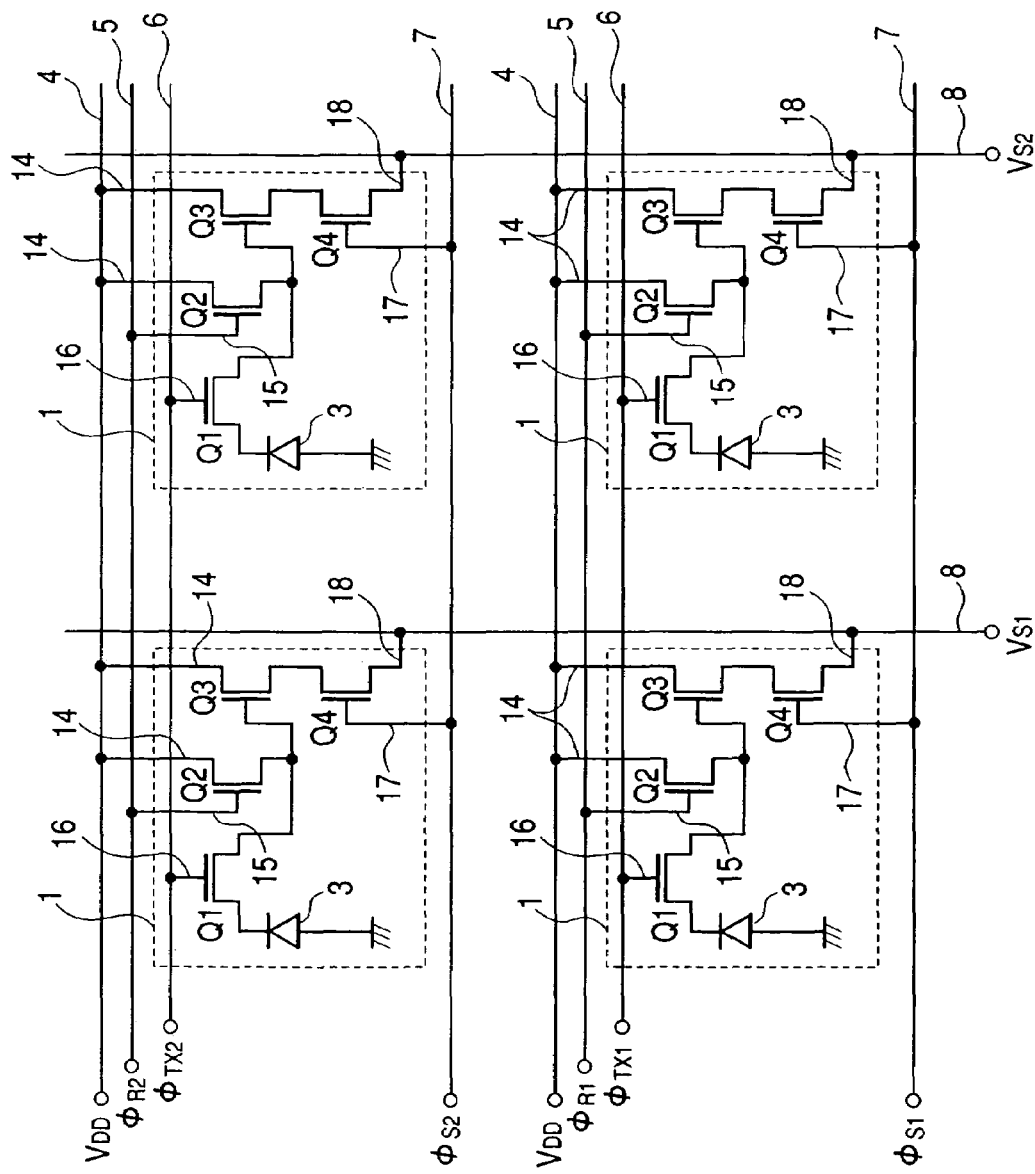
FIG. 28 is a circuit diagram of a solid image pickup device.

A schematic view of a solid image pickup system according to the present invention is shown in FIG. 27.

As shown in the FIG. 27, an image light that enters through an optical system 71 forms an image on an image sensor 72 comprising a solid image pickup device having the configuration of the above mentioned embodiments. If necessary, it is also preferable that a mechanical shutter is additionally provided in the optical system 71. With the image sensor 72, the optical information is converted into an electric signal. The electric signal undergoes signal conversion processing with a signal processing circuit 73 by predetermined means such as white balance correction, gamma correction, luminous signal formation, color signal formation, and contour correction processing, etc. and is outputted. The signal that have undergone signal processing are recorded or information-transferred by an information recording device with a recording system or communicating system 74. The signals that have undergone recording or transfer are reproduced by a reproducing system 77. The image sensor 72 and the signal processing circuit 73 are controlled by the timing control circuit 75, and the optical system 71, the timing control circuit 75, the recording system/communication system 74, and reproducing system 77 are controlled by the system control circuit 76. Selection on whether independent readout or addition/thin-out readout can be implemented with the timing control circuit 75.

As described above, according to the present invention, at least two control lines of a reset line, a selection control line, transfer control line, and a signal output line for reading out optical signals from pixels are comprised of one common line so that the following advantages and so on become available:

(1) wiring counts are reduced and the yield on wiring is improved; and (2) region occupied by wiring is reduced while the numerical aperture is improved.

What is claimed is:

1. A solid-state image pickup device comprising:
    at least one unit cell having a photoelectric conversion portion which generates a signal;
    an amplifying means for amplifying the signal generated in the photoelectric conversion portion;
    a transfer transistor for transferring the signal to said amplifying means;
    a reset transistor for resetting an input terminal of said amplifying means, wherein the amplifying means outputs the amplified signal to a signal output line; and
    a selecting transistor for selecting said amplifying means and outputting the amplified signal to the signal output line,
    wherein the signal output line for outputting the amplified signal is connected to a control terminal of said reset transistor for controlling said reset transistor.

2. The solid-state image pickup device according to claim 1, wherein during a period in which said selecting transistor is turned on, a noise signal and an optical signal are read out from the signal output line.

3. The solid-state image pickup device according to claim 1, wherein a plurality of the unit cells are arranged in a two-dimensional matrix.

4. The solid-state image pickup device according to claim 3, wherein a power line is disposed between two adjoining unit cells.

5. The solid-state image pickup device according to claim 3, further comprising a second common line which functions as a selection control line for controlling said selecting transistor which is connected to a control terminal of a transfer transistor of an adjoining unit cell.

6. The solid-state image pickup device according to claim 3, wherein a plurality of photoelectric conversion portions are connected to a common amplifying means.

7. An image pickup system comprising the solid-state image pickup device according to claim 1, an optical system for optically forming an image onto the solid-state image pickup device, and a signal processing circuit for processing an output signal from the solid-state image pickup device.

8. The solid-state image pickup device according to claim 1, wherein the photoelectric conversion portion, said amplifying means, said transfer transistor, said reset transistor, and said selecting transistor are all elements of the same conductivity type.

9. A solid-state image pickup device comprising:
    at least one unit cell having a photoelectric conversion portion which generates a signal;
    an amplifying means for amplifying the signal generated in the photoelectric conversion portion;
    a transfer transistor for transferring the signal to said amplifying means;
    a reset transistor for resetting an input terminal of said amplifying means and
    a signal output line, for outputting the amplified signal, connected to a control terminal of a transfer transistor of an adjoining unit cell.

10. The solid-state image pickup device according to claim 9, wherein a plurality of the unit cells are arranged two dimensionally.

11. The solid-state image pickup device according to claim 10, wherein a power line is disposed between two adjoining unit cells.

12. The solid-state image pickup device according to claim 10, wherein a plurality of the photoelectric conversion portions are connected to one amplifying means.

13. An image pickup system comprising the solid-state image pickup device according to claim 9, an optical system for optically forming an image onto the solid-state image pickup device, and a signal processing circuit for processing an output signal from the solid-state image pickup device.

* * * * *

UNITED STATES PATENT AND TRADEMARK OFFICE
CERTIFICATE OF CORRECTION

PATENT NO. : 7,081,607 B1
APPLICATION NO. : 09/678025
DATED : July 25, 2006
INVENTOR(S) : Toru Koizumi It is certified that error appears in the above-identified patent and that said Letters Patent is hereby corrected as shown below:

TITLE PAGE ITEM (54)

Title, "SOLID STATE" should read --SOLID-STATE--.

COLUMN 1

Line 1, "SOLID STATE" should read --SOLID-STATE--.

COLUMN 4

Line 2, "theen th" should read --the n-th--.

COLUMN 7

Line 35, "pulse VR" should read --pulse $\Phi$VR;
Line 40, "VR." should read --$\Phi$VR.--;
Line 41, "pulse S1" should read --pulse $\Phi$S1--; and
Line 44, "pulse 22" should read --pulse $\Phi$22--.

COLUMN 10

Line 60, "denote" should read --denotes--.

COLUMN 12

Line 51, "Other one" should read --another--.

COLUMN 15

Line 14, "sectional" should read --sectional view--;
Line 25, "MOS" should read --MOS transistors--;
Line 44, "necessity," should read --necessary,--; and
Line 52, "signal" should read --signals--.

UNITED STATES PATENT AND TRADEMARK OFFICE
CERTIFICATE OF CORRECTION

PATENT NO. : 7,081,607 B1
APPLICATION NO. : 09/678025
DATED : July 25, 2006
INVENTOR(S) : Toru Koizumi It is certified that error appears in the above-identified patent and that said Letters Patent is hereby corrected as shown below:

COLUMN 16

Line 64, "means" should read --means;--.

Signed and Sealed this

Thirtieth Day of January, 2007

JON W. DUDAS
*Director of the United States Patent and Trademark Office*